US008715444B2

(12) United States Patent
Yamamoto et al.

(10) Patent No.: US 8,715,444 B2
(45) Date of Patent: May 6, 2014

(54) IMAGING DEVICE AND IMAGING DEVICE MANUFACTURING METHOD

(71) Applicant: Konica Minolta Holdings, Inc., Tokyo (JP)

(72) Inventors: Natsuki Yamamoto, Kawasaki (JP); Akira Kosaka, Yao (JP); Yasutaka Tanimura, Nara (JP)

(73) Assignee: Konica Minolta Holdings, Inc., Tokyo (JP)

( * ) Notice: Subject to any disclaimer, the term of this patent is extended or adjusted under 35 U.S.C. 154(b) by 0 days.

(21) Appl. No.: 13/743,548

(22) Filed: Jan. 17, 2013

(65) Prior Publication Data
US 2013/0126083 A1 May 23, 2013

Related U.S. Application Data

(62) Division of application No. 12/933,076, filed on Sep. 20, 2010, now Pat. No. 8,384,812.

(30) Foreign Application Priority Data

Apr. 3, 2008 (JP) .................................. 2008-097228
Apr. 1, 2009 (JP) ..................... PCT/JP2009/056823

(51) Int. Cl.
*B29C 65/00* (2006.01)
*B32B 37/00* (2006.01)
*B32B 38/00* (2006.01)
*B32B 38/04* (2006.01)
*H04N 5/355* (2011.01)

(52) U.S. Cl.
USPC ........................... 156/253; 156/250; 156/252

(58) Field of Classification Search
USPC ........................................ 156/250, 252, 253
See application file for complete search history.

(56) References Cited

U.S. PATENT DOCUMENTS

| 7,728,398 B2 | 6/2010 | Nakajo et al. |
| 7,872,394 B1 | 1/2011 | Gritters et al. |

(Continued)

FOREIGN PATENT DOCUMENTS

| CN | 1897645 | 1/2007 |
| JP | 10173306 | 6/1998 |

(Continued)

OTHER PUBLICATIONS

Partial English Translation of an Office Action issued on Nov. 13, 2012 in the corresponding Japanese Patent Application No. 2010-505977.
Office Action issued on Jul. 3, 2012 in the corresponding Chinese Application, No. 2009-801095294.

*Primary Examiner* — Mark A Osele
*Assistant Examiner* — Christopher C Caillouet
(74) *Attorney, Agent, or Firm* — Cozen O'Connor

(57) ABSTRACT

A technique capable of satisfying both higher functionality and higher accuracy in a compact imaging device is sought to be provided. In order to accomplish the above object, an imaging device is formed by lamination of a plurality of layers including: an imaging element layer that has an imaging element part; a lens layer that has a lens part whose distance from the imaging element part is changeable, and is disposed between a subject and the imaging element part; and an actuator layer that has an actuator part to move the lens part, and is disposed between the subject and the imaging element part.

6 Claims, 12 Drawing Sheets

(56) References Cited

U.S. PATENT DOCUMENTS

| | | | |
|---|---|---|---|
| 2003/0213432 A1* | 11/2003 | Parent et al. | 118/719 |
| 2006/0056076 A1 | 3/2006 | Araki et al. | |
| 2007/0019102 A1 | 1/2007 | Nakajo et al. | |
| 2007/0097249 A1 | 5/2007 | Korenaga | |
| 2007/0280668 A1* | 12/2007 | Kubo et al. | 396/133 |
| 2008/0007623 A1 | 1/2008 | Lee et al. | |
| 2008/0017942 A1 | 1/2008 | Kosaka et al. | |
| 2008/0112059 A1 | 5/2008 | Choi et al. | |
| 2009/0021823 A1 | 1/2009 | Heim et al. | |
| 2009/0184605 A1 | 7/2009 | Chen | |
| 2010/0110571 A1 | 5/2010 | Ono et al. | |
| 2011/0026148 A1 | 2/2011 | Tanimura et al. | |

FOREIGN PATENT DOCUMENTS

| | | |
|---|---|---|
| JP | 2006-330559 | 12/2006 |
| JP | 2007-12995 | 1/2007 |
| JP | 2007-139862 | 6/2007 |
| JP | 2008-20812 | 1/2008 |
| JP | 2008-48388 | 2/2008 |
| JP | 2008130810 | 6/2008 |
| KR | 2007-0003699 | 1/2007 |
| WO | WO 2004-027880 | 4/2004 |
| WO | WO 2009/123266 | 10/2009 |

* cited by examiner

100

200—

400—

300—

200

400

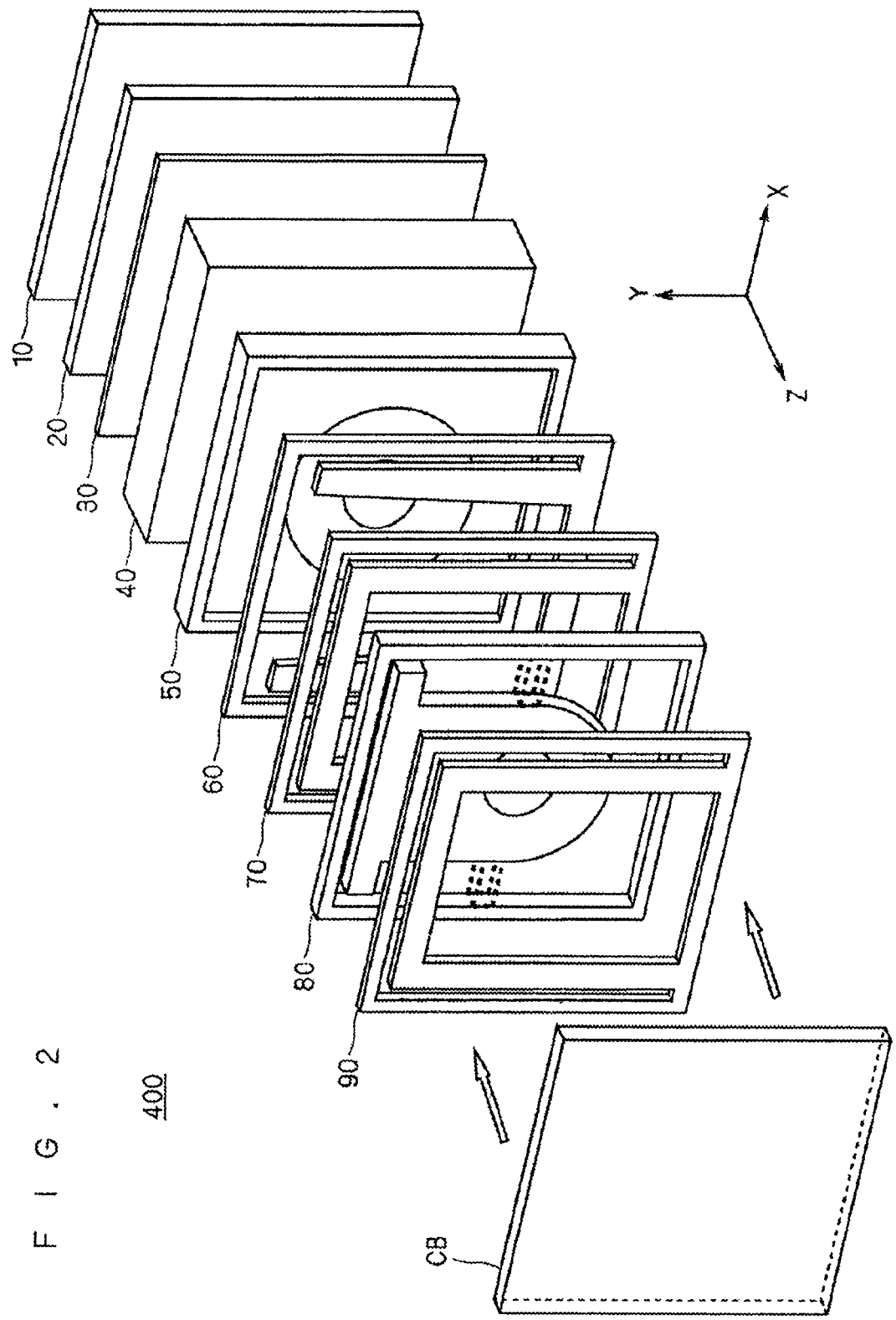

F I G . 1 2
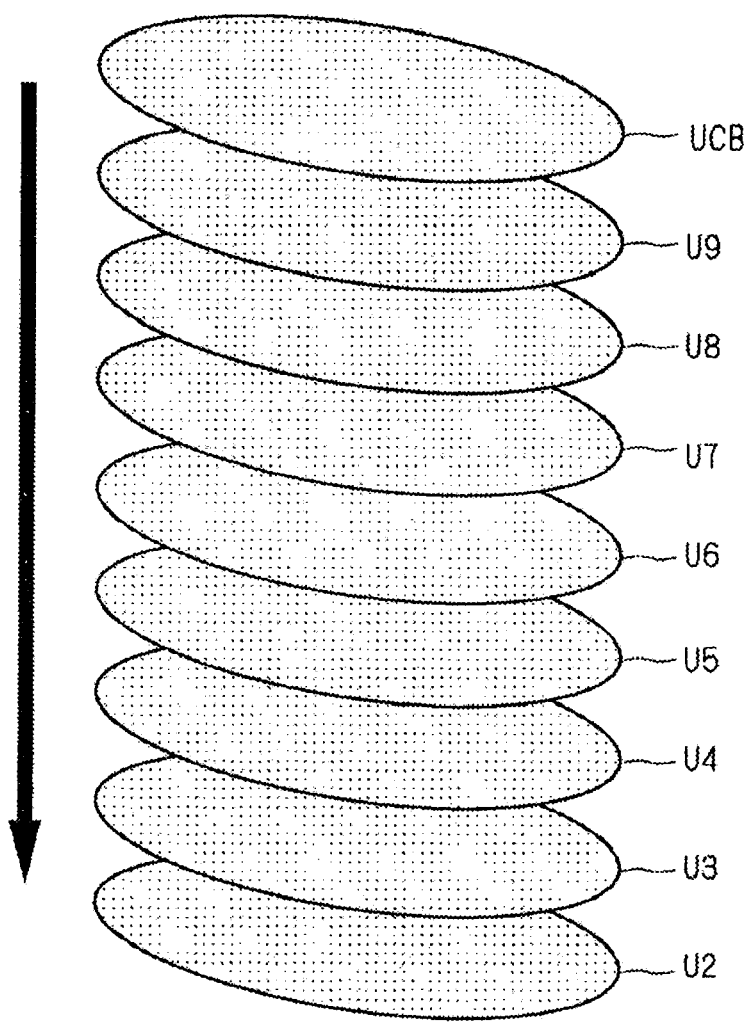

IMAGING DEVICE AND IMAGING DEVICE MANUFACTURING METHOD

RELATED APPLICATIONS

This is a division of U.S. patent application Ser. No. 12/933,076, filed on Sep. 20, 2010, which is a U.S. National Phase under 35 U.S.C. 371 of International Application No. PCT/JP2009/056823, filed in the Japanese Patent Office on Apr. 1, 2009, which claims priority on Japanese Patent Application No. 2008-097228, filed on Apr. 3, 2008.

TECHNICAL FIELD

The present invention relates to a compact imaging device and a manufacturing method therefor.

BACKGROUND ART

In recent years, a camera module has often been installed in compact electronic equipment such as a mobile telephone, and has been intended to be further reduced in size.

This camera module has conventionally been required to have a lens barrel and a lens holder that support a lens, a holder that supports an infrared (IR) cut filter, a housing that holds a laminated body made up of a substrate, an imaging element and an optical element, a resin that seals the laminated body, and the like. Therefore, when the above large number of components are sought to be reduced in size, accurately combining the large number of components to produce a camera module has not been easy.

This being the case, there has been proposed a technique in which a substrate, a semiconductor sheet formed with a large number of imaging elements and a lens array sheet formed with a large number of imaging lenses are attached with resin layers interposed therebetween to form a laminated member, and the laminated member is subjected to dicing, to complete separate camera modules (e.g., Patent Document 1, etc).

PRIOR ART DOCUMENT

Patent Document

Patent Document 1: Japanese Patent Application Laid-Open No. 2007-12995

DISCLOSURE OF THE INVENTION

Problem to be Solved by the Invention

However, even a compact camera module has been required to have higher functionality by being equipped with a variety of functions such as auto focusing and a zooming function, and the technique of the foregoing Patent Document 1 is not one capable of sufficiently meeting such a requirement for higher functionality.

The present invention was made in view of the above problem, and an object thereof is to provide a technique capable of satisfying both higher functionality and higher accuracy in a compact imaging device.

Means for Solving the Problem

For solving the above problem, an imaging device according to a first aspect is formed by lamination of a plurality of layers including: an imaging element layer that has an imaging element part; a lens layer that has a lens part whose distance from the imaging element part is changeable, and is disposed between a subject and the imaging element part; and an actuator layer that has an actuator part to move the lens part, and is disposed between the subject and the imaging element part.

An imaging device according to a second aspect is the imaging device according to the first aspect, wherein the imaging element layer has a peripheral part which surrounds the imaging element part, the lens layer has a first frame part which surrounds the lens part, the actuator layer has a second frame part which is fixedly provided with one end of the actuator part and surrounds the actuator part, the peripheral part is joined to a layer adjacent to the imaging element layer among the plurality of layers, the first frame part is joined to a layer adjacent to the lens layer among the plurality of layers, and the second frame part is joined to a layer adjacent to the actuator layer among the plurality of layers.

An imaging device according to a third aspect is the imaging device according to the second aspect, wherein the plurality of layers include: a first elastic layer having a third frame part joined with the first frame part from one direction, and a first elastic part fixedly provided at at least two points of the third frame part; and a second elastic layer having a fourth frame part joined with the first frame part from the opposite direction to the one direction, and a second elastic part fixedly provided at at least two points of the fourth frame part, and the lens layer has a lens holder which holds the lens part and is held between the first elastic part and the second elastic part.

An imaging device according to a fourth aspect is the imaging device according to the second aspect, wherein the lens layer has at least three elastic parts which connect the first frame part and the lens part.

An imaging device according to a fifth aspect is the imaging device according to the first aspect, and further provided with a wiring part which penetrates one or more layers disposed between the imaging element layer and the actuator layer among the plurality of layers, and provides the actuator layer with an electric field.

An imaging device according to a sixth aspect is the imaging device according to the first aspect, wherein the actuator layer further has a terminal part which is electrically connected to the actuator part on an outer edge and is connected to a wiring for providing the actuator part with an electric field.

An imaging device according to a seventh aspect is the imaging device according to the first aspect, wherein a resin, which joins mutually adjacent two layers included in the plurality of layers, intervenes between the two layers.

An imaging device according to an eighth aspect is the imaging device according to the first aspect, wherein the actuator part includes a substrate, and a thin film of a shape-memory alloy which is formed on the substrate.

An imaging device according to a ninth aspect is the imaging device according to the first aspect, wherein the actuator part includes a substrate, and a thin film of a piezoelectric element which is formed on the substrate.

An imaging device according to a tenth aspect is the imaging device according to the first aspect, wherein the actuator part includes a substrate, and a metal thin film which is formed on the substrate and has a linear expansion coefficient different from that of the substrate.

An imaging device manufacturing method according to an eleventh aspect includes: a sheet preparing step of preparing a plurality of sheets that include a first sheet which is formed in a predetermined array with a plurality of chips each having a lens part, and a second sheet which is formed in the predetermined array with a plurality of chips each having an actuator part; a laminated member forming step of joining, while laminating, the plurality of sheets such that each of the lens parts is supported by each of the actuator parts, to form a laminated member; and a unit generating step of cutting the laminated member with respect to each of the chips, to generate a plurality of units each having the lens part and the actuator part that movably supports the lens part.

An imaging device manufacturing method according to a twelfth aspect is the imaging device manufacturing method according to the eleventh aspect, wherein the plurality of sheets include a third sheet which is formed in the predetermined array with a plurality of chips each having an imaging element part.

An imaging device manufacturing method according to a thirteenth aspect is the imaging device manufacturing method according to the eleventh aspect, and further includes an imaging element mounting step of mounting an imaging element layer, which has an imaging element part, on each of the units generated by the unit generating step.

An imaging device manufacturing method according to a fourteenth aspect is the imaging device manufacturing method according to the twelfth aspect, wherein the plurality of sheets include a fourth sheet that is formed in the predetermined array with a plurality of chips each of which has predetermined members and is to be mounted with each of the imaging element parts, one or more sheets among the plurality of sheets which include the fourth sheet and are laminated more closely to the fourth sheet side than the second sheet in the laminated member forming step respectively have hole parts penetrating predetermined positions of the respective chips, and the imaging device manufacturing method further includes a wiring forming step of plating each of the hole parts with a metal in the middle of the laminated member forming step or after the laminated member forming step, to form a wiring part which provides the actuator part with an electric field.

An imaging device manufacturing method according to a fifteenth aspect is the imaging device manufacturing method according to the twelfth aspect, wherein each chip of the first sheet has a first frame part which surrounds the lens part, and a coupler which couples the first frame part and the lens part, the plurality of sheets include a fifth sheet which is formed in the predetermined array with a plurality of chips each having a second frame part to be joined with the first frame part from one direction, and a first elastic part fixedly provided at at least two points of the second frame part, and a sixth sheet which is formed in the predetermined array with a plurality of chips each having a third frame part to be joined with the first frame part from the opposite direction to the one direction, and a second elastic part fixedly provided at at least two points of the third frame part, and after the first, fifth and sixth sheets have been laminated and bound such that the lens part is supported by the first elastic part and the second elastic part in the laminated member forming step, the coupler is cut with respect to each chip, to separate the first frame part and the lens part.

An imaging device manufacturing method according to a sixteenth aspect is the imaging device manufacturing method according to the eleventh aspect, wherein two adjacent sheets included in the plurality of sheets are bound by a resin in the laminated member forming step.

Effect of the Invention

In accordance with the imaging device according to any of the first to tenth aspects, a plurality of layers at least including an imaging element layer, a lens layer and an actuator layer are laminated to form an imaging device, and it is thus possible to satisfy both higher functionality and higher accuracy in a compact imaging device.

Further, in accordance with the imaging device according to the second aspect, adjacent layers included in the plurality of layers constituting the imaging device are joined to each other on peripheral portions and frame parts, and it is thus possible to readily seal an imaging element part, a lens part and an actuator part.

Further, in accordance with the imaging device according to the third aspect, it is possible to change a distance between the lens part and the imaging element part without displacing a direction of an optical axis of the lens part.

Further, in accordance with the imaging device according to the fourth aspect, another layer having an elastic part for holding the lens part becomes unnecessary, and it is thus possible to seek improvement in assembly accuracy due to simplification of a structure of the imaging device, and reduction in thickness and size of the imaging device.

Further, in accordance with either the imaging device according to the fifth aspect or the imaging device manufacturing method according to the fourteenth aspect, it is possible to readily and accurately form a wiring part for providing the actuator part with an electric field.

Further, in accordance with the imaging device according to the sixth aspect, it is possible to readily produce each layer disposed between the imaging element layer and the actuator layer.

Further, in accordance with either the imaging device according to the seventh aspect or the imaging device manufacturing method according to the sixteenth aspect, the plurality of layers can be readily joined in a short period of time, and it is thus possible to seek improvement in productivity and reduction in manufacturing cost of the imaging device.

Further, in accordance with the imaging device manufacturing method according to any of the eleventh to sixteenth aspects, a plurality of units each having a plurality of functions including the lens part and the actuator part are integrally formed and thereafter separated with respect to each unit, and it is thus possible to readily and accurately combine members that realize the plurality of functions. In other words, it is possible to satisfy both higher functionality and higher accuracy in a compact imaging device.

Further, in accordance with the imaging device manufacturing method according to the twelfth aspect, it is possible to readily and accurately combine members that realize a plurality of functions including the imaging element part.

Further, in accordance with the imaging device manufacturing method according to the thirteenth aspect, the imaging element part can be mounted after an assembly status of a unit having a plurality of functions including the lens part and the actuator part has been checked, and it is thus possible to reduce wasteful disposal of the imaging element part associated with unit failure. In other words, it is possible to reduce manufacturing cost of the imaging device and waste of resources.

Further, in accordance with the imaging device manufacturing method according to the fifteenth aspect, in the state of the sheet formed with a plurality of chips, the lens part of each chip is supported by the elastic part and thereafter brought into a movable state, and it is thus possible to accurately combine the lens part and the actuator part. It is therefore possible, for example, to prevent eccentricity of the optical axis of the lens part in each unit.

BRIEF DESCRIPTION OF THE DRAWINGS

FIG. 2 is an exploded perspective view showing a constitutional example of the camera module according to the embodiment of the present invention.

FIG. 12 is a view for explaining binding of a plurality of sheets.

BEST MODE FOR CARRYING OUT THE INVENTION

Hereinafter, an embodiment of the present invention will be described with reference to the drawings.

Figure 1A:
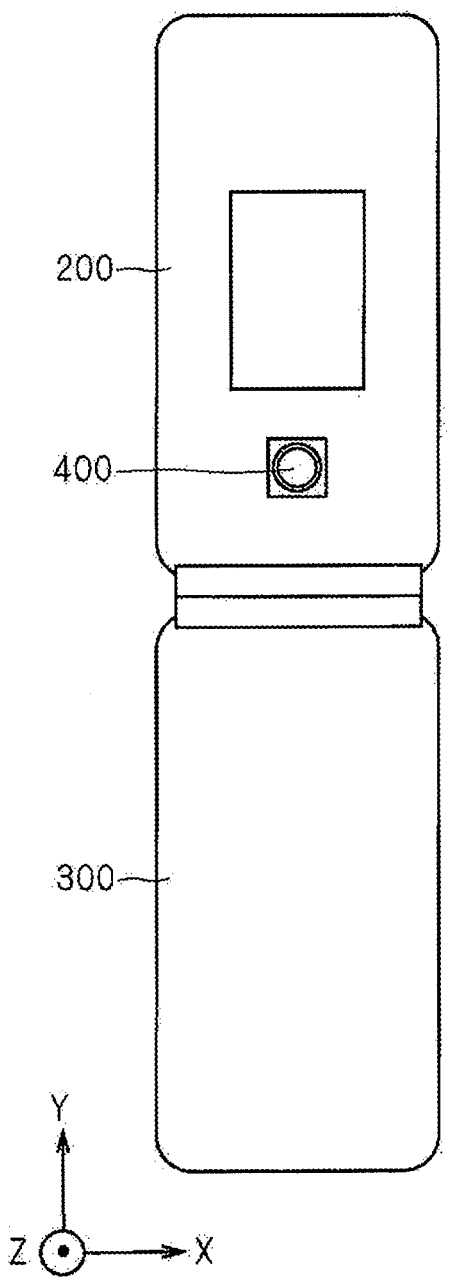
FIGS. 1A and 1B are views illustrating a schematic configuration of a mobile telephone including a camera module according to an embodiment of the present invention.
Figure 1B:
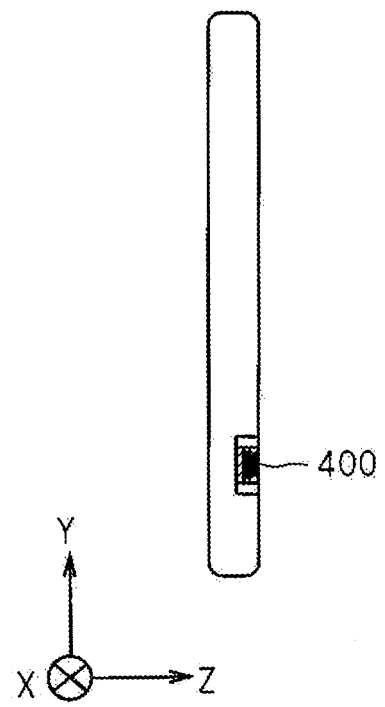

FIGS. 1A and 1B are diagrammatic views illustrating a schematic configuration of a mobile telephone 100 installed with a camera module 400 according to an embodiment of the present invention. It is to be noted that in FIG. 1A and figures after FIG. 1A, three mutually orthogonal axes X, Y, Z are provided as appropriate for the sake of clarifying directional relations.

As shown in FIG. 1A, the mobile telephone 100 is provided with an image acquiring/regenerating part 200 and a body 300. The image acquiring/regenerating part 200 has the camera module 400 and a display (not shown), and the body 300 has a control part that controls the whole of the mobile telephone 100 and a variety of buttons (not shown) such as ten keys. In addition, the image acquiring/regenerating part 200 and the body 300 are connected by a rotatable hinge part, to make the mobile telephone 100 foldable.

FIG. 1B is a sectional diagrammatic view focusing on the image acquiring/regenerating part 200 within the mobile telephone 100. As shown in FIGS. 1A and 1B, the camera module 400 is a compact imaging device, namely, a so-called micro camera unit (MCU), having a size of about 5 square mm in an X-Y cross section and a thickness (depth in the Z direction) of the order of about 3 mm.

Hereinafter, a configuration of the camera module 400 and a manufacturing process therefor will be sequentially described.

<Configuration of Camera Module>

FIG. 2 is an exploded perspective view diagrammatically showing a constitutional example of the camera module 400.

As shown in FIG. 2, a camera module 400 is formed by lamination of ten layers, which are an imaging element layer 10, an imaging sensor holder layer 20, an infrared cut filter layer 30, a first lens layer 40, a second lens layer 50, an actuator layer 60, a parallel spring lower layer 70, a third lens layer 80, a parallel spring upper layer 90 and a protective layer CB, in this order. Each two mutually adjacent layers included in the ten layers are joined by a resin such as an epoxy resin, and hence the resin intervenes between the respective layers.

Further, each of the layers 10 to 90, CB has an outer shape being substantially the same rectangular (herein, a square of about 5 mm per side) on the surface in the ±Z direction. It is to be noted that as for the third lens layer 80, couplers 84a, 84b (cf. FIG. 4B) drawn by thick broken lines in the figure are cut in the middle of manufacturing of the camera module 400, and a frame F8 and a lens part 81 come into a separated state, which will be described later.

<Configuration of Each Layer>

FIGS. 3A to 3F and 4A to 4D are plan views showing respective constitutional examples of the imaging element layer 10, the imaging sensor holder layer 20, the infrared cut filter layer 30, the first lens layer 40, the second lens layer 50, the actuator layer 60, the parallel spring lower layer 70, the third lens layer 80, the parallel spring upper layer 90 and the protective layer CB.

Figure 3A:
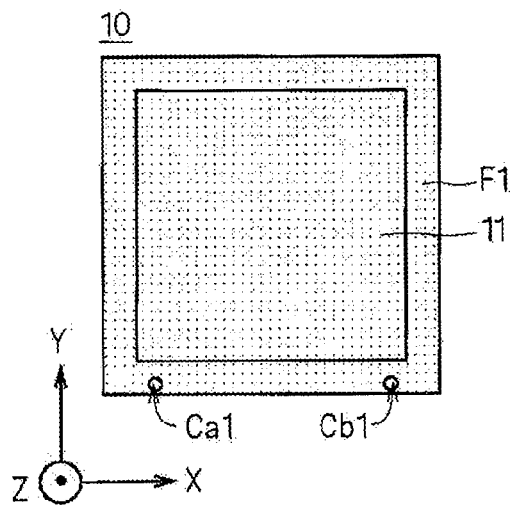
FIGS. 3A to 3F are plan views showing a constitutional example of each layer constituting the camera module.

Imaging Element Layer 10:

As shown in FIG. 3A, the imaging element layer 10 is a chip which is provided with an imaging element part 11 that is formed, for example, of a CMOS sensor, a CCD sensor or the like, a peripheral circuit thereof, and a peripheral part F1 that surrounds the imaging element part 11. It should be noted that, although omitted from the figure here, a variety of terminals for connecting wiring for providing the imaging element part 11 with a signal and reading the signal from the imaging element part 11 are provided on the rear surface (−Z side surface) of the imaging element layer 10.

Further, at two predetermined points of the peripheral part F1, minute holes (through holes) Ca1, Cb1 penetrating along the Z direction are provided, and the through holes Ca1, Cb1 are filled with a material with conductivity (a conductive material). Inner diameters of the minute through holes Ca1, Cb1 are set, for example, to the order of several tens of μm. Moreover, the +Z side surface of the imaging element part 11 functions as a surface (imaging surface) that receives light from a subject, and the peripheral part F1 is joined to the imaging sensor holder layer 20 adjacent to the +Z side of the imaging element layer 10.

Figure 3B:
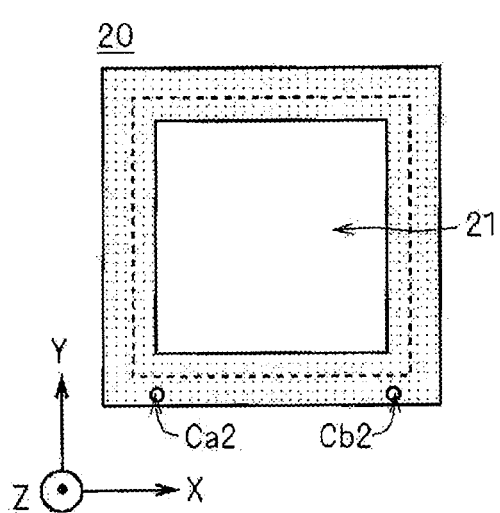

Imaging Sensor Holder Layer 20:

As shown in FIG. 3B, the imaging sensor holder layer 20 is a chip which is formed, for example, of a material such as a resin and holds the imaging element layer 10 mounted thereon by joining. Specifically, at the substantially center of the imaging sensor holder layer 20, an opening 21 having a substantially square cross section is provided along the Z direction, and the cross section of the opening 21 become smaller toward the +Z side. In addition, the square drawn by broken lines in FIG. 3B shows an outer edge of the opening 21 on the −Z side surface.

Further, in a similar aspect to that of the imaging element layer 10, at two predetermined points of a peripheral part of the imaging sensor holder layer 20, minute holes (through holes) Ca2, Cb2 penetrating along the Z direction are provided, and the through holes Ca2, Cb2 are filled with the conductive material. Moreover, the −Z side surface of the peripheral part of the imaging sensor holder layer 20 is joined to the adjacent imaging element layer 10, and the +Z side surface of the peripheral part is joined to the adjacent infrared cut filter layer 30.

Figure 3C:
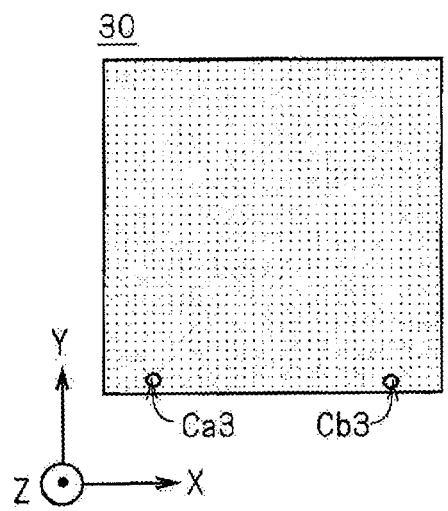

Infrared Cut Filter Layer 30:

As shown in FIG. 3C, the infrared cut filter layer 30 is a chip of a filter which is configured by multi-layering of transparent thin films with different refractive indexes on a transparent substrate, and cuts infrared rays. Specifically, the infrared cut filter layer 30 is one where a large number of transparent thin films with different refractive indexes are formed on the upper surface of a substrate that is made up, for example, of glass or a transparent resin by sputtering or some other means, and a wave length band of transmitted light is controlled by combination of thicknesses and refractive indexes of the thin films. For example, as the infrared cut filter layer 30, one that blocks light with a wavelength band of not smaller than 600 nm is preferred.

Further, in a similar aspect to those of the imaging element layer 10 and the like, at two predetermined points of a peripheral part of the infrared cut filter layer 30, minute holes (through holes) Ca3, Cb3 penetrating along the Z direction are provided, and the through holes Ca3, Cb3 are filled with the conductive material. Moreover, the −Z side surface of the peripheral part of the infrared cut filter layer 30 is joined to the adjacent imaging sensor holder layer 20, and the +Z side surface of the peripheral part is joined to the adjacent first lens layer 40.

Figure 3D:
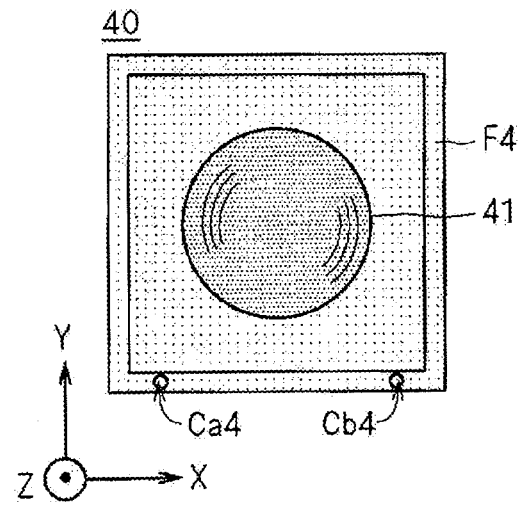

First Lens Layer 40:

As shown in FIG. 3D, the first lens layer 40 is a chip which is formed by integral molding of a lens part 41 that is made up of an optical lens having a positive lens power, and a frame part F4 that surrounds the lens part 41 and constitutes a peripheral part of the first lens layer 40, using the same material. Examples of the material to constitute the first lens layer 40 include a phenolic resin, an acrylic resin, and glass. It is to be noted that the lens part 41 is an optical lens which refracts light such that a focus by the first to third lens layers 40, 50, 80 corresponds to the imaging element part 11.

Further, in a similar aspect to those of the imaging element layer 10 and the like, at predetermined two points of the frame part F4, minute holes (through holes) Ca4, Cb4 penetrating along the Z direction are provided, and the through holes Ca4, Cb4 are filled with the conductive material. Moreover, the −Z side surface of the frame part F4 is joined to the adjacent infrared cut filter layer 30, and the +Z side surface of the frame part F4 is joined to the adjacent second lens layer 50.

Figure 3E:
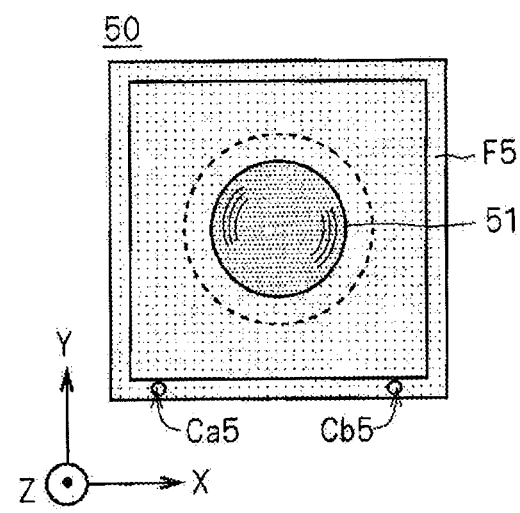

Second Lens Layer 50:

As shown in FIG. 3E, the second lens layer 50 is a chip which is formed by integral molding of a lens part 51 that is made up of an optical lens having a negative lens power, and a frame part F5 that surrounds the lens part 51 and constitutes a peripheral part of the second lens layer 50, using the same material. As with the case of the first lens layer 40, examples of the material to constitute the second lens layer 50 include a phenolic resin, an acrylic resin, and glass. It is to be noted that as with the lens part 41, the lens part 51 is an optical lens which reflects light such that the focus by the first to third lens layers 40, 50, 80 corresponds to the imaging element part 11.

Further, in a similar aspect to those of the imaging element layer 10 and the like, at two predetermined points of the frame part F5, minute holes (through holes) Ca5, Cb5 penetrating along the Z direction are provided, and the through holes Ca5, Cb5 are filled with the conductive material. Moreover, the −Z side surface of the frame part F5 is joined to the adjacent first lens layer 40 (specifically, the frame part F4), and the +Z side surface of the frame part F5 is joined to the adjacent actuator layer 60.

Figure 3F:
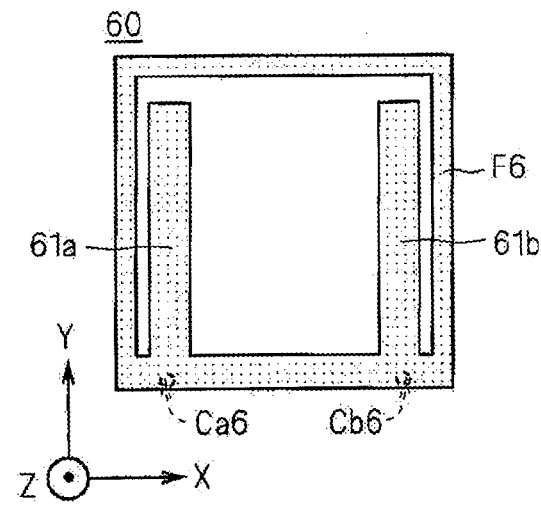

Actuator Layer 60:

As shown in FIG. 3F, the actuator layer 60 is a chip which is disposed at the imaging surface side of the imaging element layer 10, while being provided with thin plate-like actuator parts 61a, 61b that move a lens part 81 of the third lens layer 80. In this actuator layer 60, an element (actuator element) for displacement is formed in the shape of a thin plate on a substrate made of silicon (Si). In the present embodiment, a shape-memory alloy (SMA) is used as the actuator element.

Further, the actuator layer 60 is provided with a frame part F6 constituting a peripheral part, and the two plate-like actuator parts 61a, 61b projected from the frame part F6 toward a hollow portion inside the frame part F6. In other words, one ends of the two actuator parts 61a, 61b are respectively fixedly provided on the frame part F6, and the frame part F6 is formed so as to surround the two actuator parts 61a, 61b.

More specifically, the frame part F6 is formed by disposition of four plate-like members in square shape which are made up of two plate-like members extendedly provided in parallel with the X axis and forming two mutually opposing sides, and two plate-like members extendedly provided in parallel with the Y axis and forming two mutually opposing sides. Further, within an inner edge of the frame part F6 formed by one plate-like member (herein, the −Y side plate-like member) among the four plate-like members, the one end of the actuator part 61a is fixedly provided on a predetermined part in the vicinity of the −X side end part (the one end) (hereinafter referred to as "one predetermined part"), and the one end of the actuator part 61b is fixedly provided on a predetermined part in the vicinity of the +X side end part (the other end) (hereinafter referred to as "the other predetermined part"). In other words, the respective one ends of the two actuator parts 61a, 61b are ends fixed to the frame part F6 (fixed ends), and the respective other ends of the two actuator parts 61a, 61b are ends whose relative positions to the frame part F6 are freely changed (free ends).

Further, at two predetermined points of the frame part F6 (similar positions to those of element layer 10 and the like), minute hole parts Ca6, Cb6 are provided along the Z direction from the rear surface (herein, the −Z side surface) of the frame part F6 to the middle of the frame part F6. Moreover, the −Z side surface of the frame part F6 is joined to the adjacent second lens layer 50 (specifically, the frame part F5), and the +Z side surface of the frame part F6 is joined to the adjacent parallel spring lower layer 70.

A detailed configuration and operation of the actuator layer 60 will be described herein.

FIGS. 5A to 5E are views for explaining the detailed configuration of the actuator layer 60.

Figure 5A:
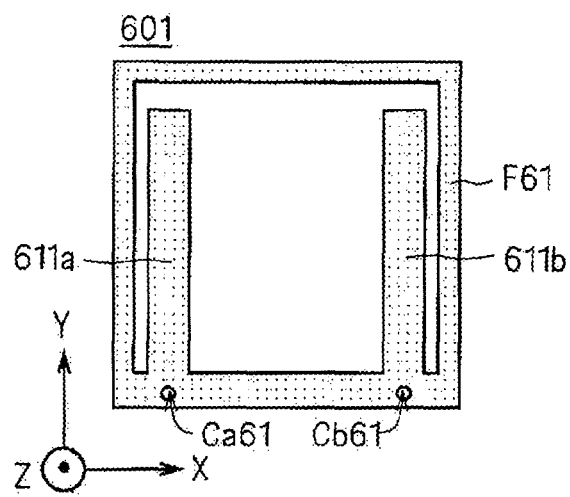
FIGS. 5A to 5E are views for explaining a detailed constitutional example of an actuator layer.
Figure 5D:
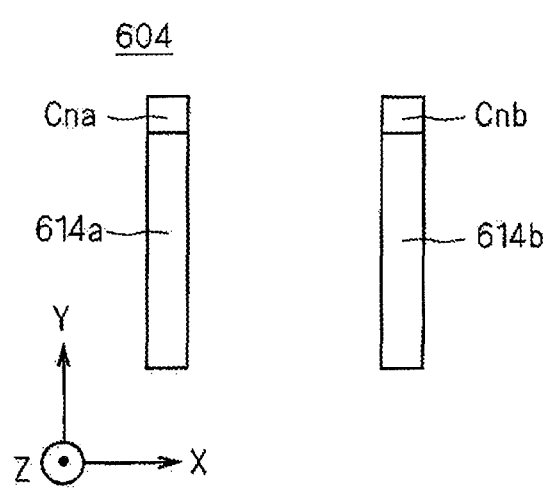
Figure 5B:
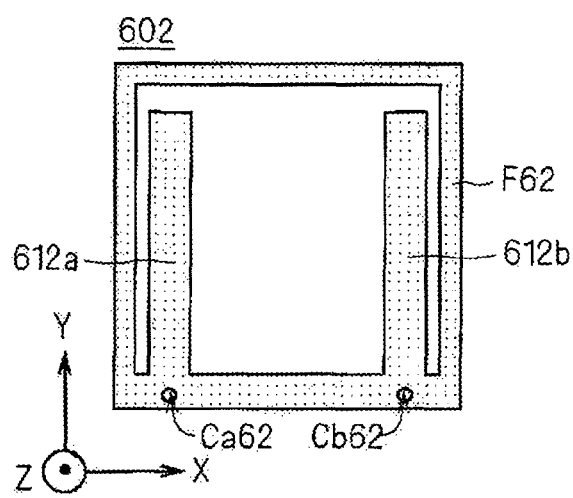
Figure 5E:
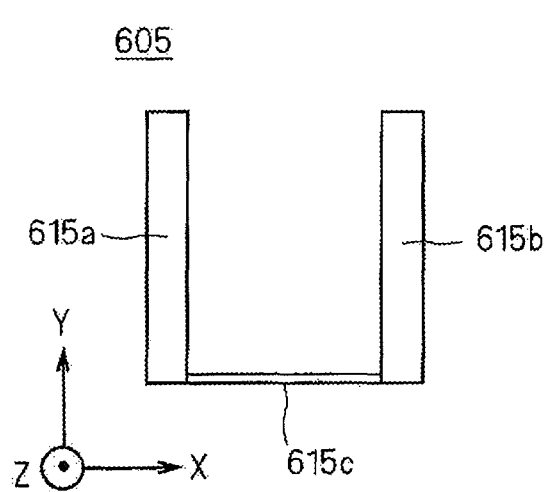
Figure 5C:
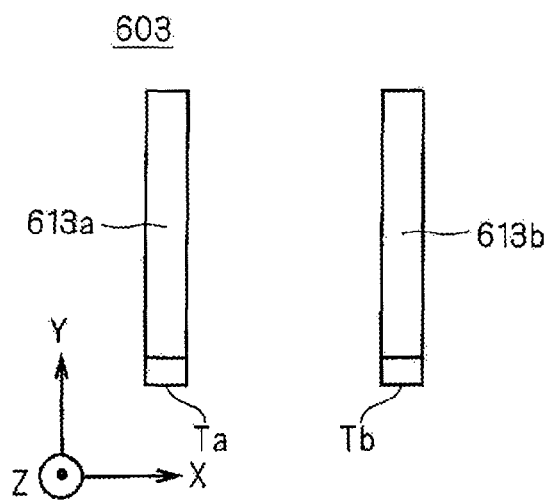

The actuator layer 60 is configured by lamination of an insulating layer 602 shown in FIG. 5B, a first actuator element layer 603 shown in FIG. 5C, an insulating/conductive layer 604 shown in FIG. 5D, and a second actuator element layer 605 shown in FIG. 5E in this order on a base layer 601 shown in FIG. 5A.

As shown in FIG. 5A, the base layer 601 is made up, for example, of a material with appropriate rigidity (e.g. silicon, metal, etc.), and is made up of a plate-like base member having a frame part 61 and protruding parts 611a, 611b.

The frame part F61 is a portion to be joined and fixed to the second lens layer 50. This protruding part 611a is a plate-like portion protruded from one predetermined part of the frame part F61, and the protruding part 611b is a plate-like portion protruded from the other predetermined portion of the frame part F61.

In other words, in this base layer 601, the respective one ends of the protruding parts 611a, 611b are fixedly provided on the frame part F61 to be the fixed ends, and the respective other ends of the protruding parts 611a, 611b are free ends, and the frame part F61 is formed so as to surround the protruding parts 611a, 611b. Further, at two predetermined points of the frame part F61 (similar positions to those of the imaging element layer 10 and the like), minute through holes Ca61, Cb61 are provided along the Z direction, and the through holes Ca61, Cb61 are filled with the conductive material.

As shown in FIG. 5B, the insulating layer 602 is made up of a material without conductivity (e.g. organic substance), and has the identical shape to that of the base layer 601. This insulating layer 602 is formed, for example, of an organic substance with a predetermined thickness by vapor deposition using a mask, or the like over the upper surface (+Z side surface) of the base layer 601. Therefore, the insulating layer 602 has a film-like frame part F62 formed on the upper surface of the frame part F61, and protruding parts 612a, 612b respectively formed on the upper surfaces of the protruding parts 611a, 611b. Herein, the frame part F6 of the actuator layer 60 is configured primarily of the frame parts F61, F62 which are laminated vertically. Further, at predetermined two points of the frame part F62 (similar positions to those of the imaging element layer 10 and the like), minute through holes Ca62, Cb62 along the Z direction are provided, and the through holes Ca62, Cb62 are filled with the conductive material.

In addition, taking the ease of manufacturing into consideration, a technique of forming an insulating layer on the base layer 601 not provided with the through holes Ca61, Cb61 and then simultaneously forming the minute through holes Ca61, Cb61, Ca62, Cb62 by such a means as embossing is preferred.

As shown in FIG. 5C, the first actuator element layer 603 has two displacement element parts 613a, 613b and two electrode parts Ta, Tb.

The displacement element part 613a is provided on the protruding parts 611a, 612a, and made up of a thin plate-like element (herein, the shape-memory alloy) that expands and contracts in accordance with application of a voltage. Further, the displacement element part 613b has a similar shape to that of the displacement element part 613a, and is provided on the protruding parts 611b, 612b, and made up of a thin plate-like element (herein, the shape-memory alloy) that expands and contracts in accordance with application of a voltage. It is to be noted that the displacement element parts 613a, 613b are formed, for example, by film formation by means of sputtering, or formed by joining of elements having been stretched into frame shape with use of an adhesive or the like.

The electrode part Ta is a portion that is made up, for example, of a metal excellent in conductivity, or the like and electrically connected to the vicinity of the end part of one predetermined part side (a fixed end) within the displacement element part 613a, to apply a voltage supplied from the conductive material with which the through holes Ca61, Ca62 are filled to the displacement element part 613a. Herein, the electrode part Ta is provided directly on the through hole Ca62. As with the electrode part Ta, the electrode part Tb is a portion that is made up, for example, of metal excellent in conductivity, or the like and electrically connected to the vicinity of the end part of the other predetermined part side (a fixed end) within the displacement element part 613b, to apply the voltage supplied from the conductive material with which the through holes Cb61, Cb62 are filled to the displacement element part 613b. Herein, the electrode part Tb is provided directly on the through hole Cb62.

As shown in FIG. 5D, the insulating/conductive layer 604 has insulating films 614a, 614b and conductor parts Cna, Cnb.

The insulating film 614a is a film without electric conductivity (an insulating film) which is provided in the shape of a thin film over the entire area from the fixed end to a position slightly before the free end within the upper surface of the displacement element part 613a. Further, the insulating film 614b is a film without electric conductivity (an insulating film) which is provided in the shape of a thin film over the entire area from the fixed end to a position slightly before the free end within the upper surface of the displacement element part 613b. These insulating films 614a, 614b are formed, for example, by vapor deposition of an organic substance using a mask, or some other means.

The conductor part Cna is a film with electric conductivity (a conductive film) which is provided in the vicinity of the end part of the opposite side to the one predetermined part (a free end) within the upper surface of the displacement element part 613a. Further, the conductor part Cnb is a conductive film provided in the vicinity of the end part of the opposite side to the other predetermined part (a free end) within the upper surface of the displacement element part 613b. The conductor parts Cna, Cnb are formed by film formation, for example, by means of sputtering or the like.

As shown in FIG. 5E, the second actuator element layer 605 has two the displacement element parts 615a, 615b, and a connector part 615c.

The displacement element parts 615a, 615b are made up of a material similar to those for the displacement element part 613a, 613b and formed, for example, by film formation by means of sputtering, or formed by joining of elements having been stretched into frame shape with use of an adhesive or the like. The displacement element part 615a is provided almost over the upper surfaces of the insulating film 614a and the conductor part Cna, and the displacement element part 615b is provided almost over the upper surfaces of the insulating film 614b and the conductor part Cnb. Therefore, the displacement element part 613a and the displacement element part 615a are formed so as to sandwich the insulating film 614a and the conductor part Cna therebetween, and the displacement element part 613a and the displacement element part 615a are electrically connected by the conductor part Cna in the vicinity of the free end. Further, the displacement element part 613b and the displacement element part 615b are formed so as to sandwich the insulating film 614b and the conductor part Cnb therebetween, and the displacement element part 613b and the displacement element part 615b are electrically connected by the conductor part Cnb in the vicinity of the free end.

The connector part 615c is wiring which is provided on the upper surface side of the frame part F61 (specifically, the upper surface of the frame part F62), and electrically connects the displacement element part 615a and the displacement element part 615b in the vicinity of the fixed ends. This connector part 615c is made up, for example, of a metal excellent in conductivity, or the like, and formed by film formation by means of sputtering, or the like.

It is assumed that the displacement element parts 613a, 613b, 615a, 615b are subjected to heat treatment to memorize shapes (memory heat treatment) on a timely basis so as to be shrunk during heating.

Herein, operations of the actuator parts 61a, 61b will be described taking the operation of the actuator part 61b as an example.

Figure 6A:
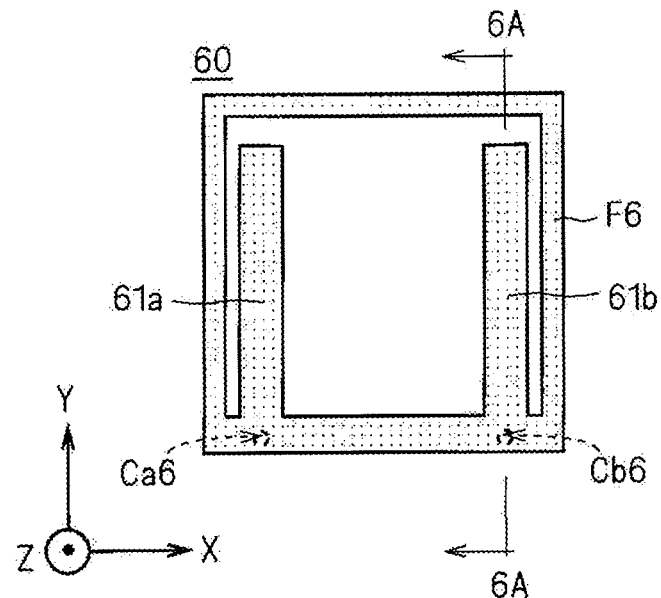
FIGS. 6A to 6C are views for explaining an operating example of an actuator part.
Figure 6B:
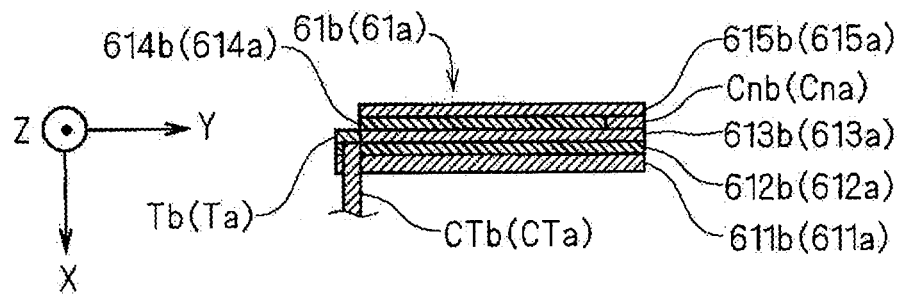
Figure 6C:
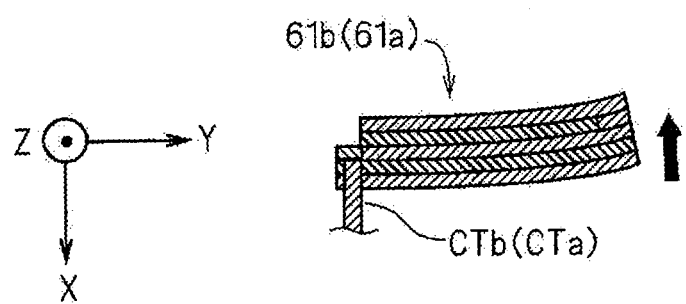

FIGS. 6A to 6C are views for explaining the operation of the actuator part 61b. FIG. 6A is a plan view showing a configuration of the actuator layer 60 as with FIG. 3F, and FIGS. 6B and 6C are sectional diagrammatic views focusing on the actuator part 61b, as seen from a sectional line 6A-6A of FIG. 6A.

It should be noted that in FIGS. 6B and 6C, wiring CTb is shown which is formed by filling of the through holes Cb1 to Cb5, Cb61, Cb62 with the conductive material. The wiring CTb is electrically connected to the displacement element part 613b through the electrode part Tb, and a voltage is applied from a power circuit (not shown) of the body 300 to the actuator part 61b through the wiring CTb. In addition, similarly in the displacement element part 613a, the wiring CTa formed by filling of the through holes Ca1 to Ca5, Ca61, Ca62 with the conductive material is electrically connected to the displacement element part 613a through the electrode part Ta, and a voltage is applied from the power circuit to the actuator part 61a through the wiring CTa.

Herein, nine portions constituting the two actuator parts 61a, 61b, i.e. the electrode part Ta, the displacement element part 613a, the conductor part Cna, the displacement element part 615a, the connector part 615c, the displacement element part 615b, the conductor part Cnb, the electrode part Tb and the displacement element part 615b, are connected in this order in series between the wiring CTa, CTb.

In FIG. 6B, a state (initial state) where the actuator part 61b has not been transformed is shown. In the initial state, the voltage has not been applied to the displacement element parts 613b, 615b, and the displacement element parts 613b, 615b are in a constant-temperature state. Therefore, the displacement element parts 613b, 615b are formed into plate shape by elastic force of the protruding part 611b of the base layer 601, and the actuator part 61b takes almost flat shape.

When the voltage is applied to the displacement element parts 613b, 615b in the initial state shown in FIG. 6B, a current flows through the displacement element parts 613b, 615b, and the displacement element parts 613b, 615b are heated by Joule heat. When temperatures of the displacement element parts 613b, 615b exceed a predetermined transformation start temperature, the displacement element parts 613b, 615b shrinks. At this time, the actuator part 61b is transformed such that a difference is generated between extended distances of the displacement element parts 613b, 615b and an extended distance of the protruding part 611b and the free end of the actuator part 61b shifts upward, as shown in FIG. 6C.

Further, upon completion of the application of the voltage to the displacement element parts 613b, 615b, the extended distances of the displacement element parts 613b, 615b return to the initial states by natural cooling, and the actuator part 61b returns to the initial state of not being transformed.

It is to be noted that herein, the two actuator parts 61a, 61b are electrically connected by the connector part 615c, and simultaneously energized and heated. For this reason, the two actuator parts 61a, 61b are transformed in substantially the same timing and mechanism into substantially the same shape.

Figure 4A:
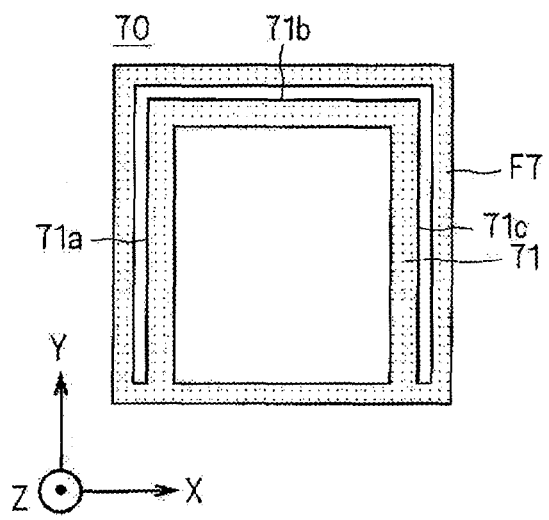
FIGS. 4A to 4D are plan views showing a constitutional example of each layer constituting the camera module.

Parallel Spring Lower Layer 70:

As shown in FIG. 4A, the parallel spring lower layer 70 is a chip which is made up of a metal material such as phosphor bronze and has the frame part F7 and the elastic part 71, and is a layer forming a spring mechanism (an elastic layer).

The frame part F7 constitutes a peripheral part of the parallel spring lower layer 70. The −Z side surface of the frame part F7 is joined to the adjacent actuator layer 60 (specifically, the frame part F6), and the +Z side surface of the frame part F7 is joined to the adjacent third lens layer 80.

The elastic part 71 is formed by connection in U shape of three plate-like members 71a, 71b, 71c, that substantially linearly extend, and respective one ends of the two plate-like members 71a, 71c on both sides among the three plate-like members 71a, 71b, 71c, namely both ends of the elastic part 71, are fixedly provided at two points of the frame part F7. Herein, the elastic part 71 is disposed in a hollow portion inside the frame part F7, and hence the frame part F7 is formed so as to surround the elastic part 71.

More specifically, as with the case of the frame part F6, the frame part F7 is formed by disposition of four plate-like materials in square shape which are made up of two plate-like members extendedly provided in parallel with the X axis and forming two mutually opposing sides, and two plate-like members extendedly provided in parallel with the Y axis and forming two mutually opposing sides. Further, within an inner edge of the frame part F7 formed by one plate-like member (herein, the −Y side plate-like member) among the four plate-like members, the one end of the elastic part 71 (specifically, one end of the plate-like member 71a) is fixedly provided on a predetermined part in the vicinity of the −X side end part (one end) (hereinafter referred to as "one predetermined part"), and the one end of the elastic part 71 (specifically, one end of the plate-like member 71c) is fixedly provided on a predetermined part in the vicinity of the +X side end part (the other end) (hereinafter referred to as "the other predetermined part").

Moreover, the lower surfaces (−Z side surfaces) of the two plate-like members 71a, 71c on both sides among the three plate-like members 71a, 71b, 71c constituting the elastic part 71 are in contact with the upper surfaces (+Z side surfaces) of the actuator parts 61a, 61b. Therefore, in accordance with transformation of the actuator parts 61a, 61b shown in FIGS. 6A to 6C, the two plate-like members 71a, 71c are elastically transformed such that a relative position of the plate-like member 71b with respect to the frame part F7 is shifted to the +Z side.

Figure 4C:
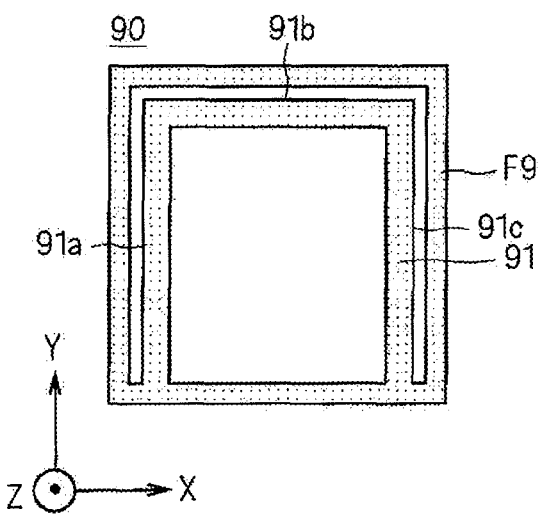
Figure 4B:
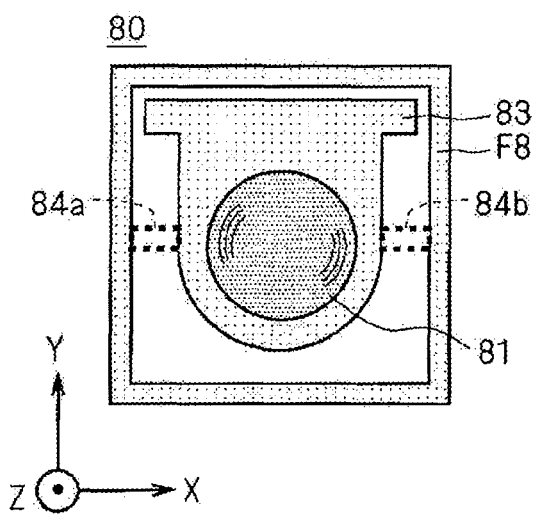

Third Lens Layer 80:

As shown in FIG. 4B, the third lens layer 80 is a chip which has a frame part F8, a lens part 81 and a lens holder 83. Examples of the material to constitute this third lens layer 80 include a phenolic resin, an acrylic resin, and glass, as with the cases of the first and second lens layers 40, 50.

The frame part F8 constitutes a peripheral part of the third lens layer 80. Specifically, the frame part F8 is formed by disposition of four plate-like materials in square shape which are made up of two plate-like members extendedly provided in parallel with the X axis and forming two mutually opposing sides, and two plate-like members extendedly provided in parallel with the Y axis and forming two mutually opposing sides. The lens part 81 and the lens holder 83 are disposed in a hollow portion formed inside the frame part F8, and hence the lens part 81 and the lens holder 83 are in the state of being surrounded by the frame part F8. Further, the −Z side surface of the frame part F8 is joined to the adjacent parallel spring lower layer 70 (specifically, the frame part F7), and the +Z side surface of the frame part F8 is joined to the adjacent parallel spring upper layer 90.

The lens part 81 is an optical lens whose distance from the imaging element part 11 is changeable, and herein has positive lens power.

The lens holder 83 holds the lens part 81, and held between the elastic part 71 of the parallel spring lower layer 70 and a elastic part 91 of the later-described parallel spring upper layer 90. Specifically, for example, the lens holder 83 is integrally molded with the lens part 81, and within the end part of +Y side of the lens holder 83, the −Z side surface is joined with the elastic part 71 and the +Z side surface is joined with the elastic part 91.

It is to be noted that as for the third lens layer 80, couplers 84a, 84b drawn by a thick broken line in FIG. 4B are cut in the middle of manufacturing of the camera module 400, and the frame part F8, the lens part 81 and the lens holder 83 come into a separated state, to form the third lens layer 80. The cutting of the couplers 84a, 84b will be further described later.

Parallel Spring Upper Layer 90:

As shown in FIG. 4C, the parallel spring upper layer 90 is a chip having a similar configuration as that of the parallel spring lower layer 70, the chip being made up of a metal material such as phosphor bronze and having the frame part F9 and the elastic part 91, and is a layer (elastic layer) forming a spring mechanism.

The frame part F9 constitutes a peripheral part of the parallel spring lower layer 90. The −Z side surface of the frame part F9 is joined to the adjacent third lens layer 80 (specifically, the frame part F8), and the +Z side surface of the frame part F9 is joined to the adjacent protective layer CB.

As with the elastic part 71, the elastic part 91 is formed by connection in U shape of three plate-like members 91a, 91b, 91c, that substantially linearly extend, and respective one ends of the two plate-like members 91a, 91c on both sides among the three plate-like members 91a, 91b, 91c, namely both ends of the elastic part 91, are fixedly provided at two points of the frame part F9. Herein, the elastic part 91 is disposed in a hollow portion inside the frame part F9, and hence the frame part F9 is formed so as to surround the elastic part 91. A more specific configuration of the frame part F9 is similar to that of the frame part F7 described above, and hence a description thereof is omitted herein.

It is to be noted that the lower surface (−Z side surface) of the one plate-like member 91b at the center among the three plate-like members 91a, 91b, 91c constituting the elastic part 91 is joined to the lens holder 83, whereby the lens holder 83 is held between the elastic part 71 and the elastic part 91. In accordance with transformation of the actuator parts 61a, 61b shown in FIGS. 6A to 6C, the two plate-like members 91a, 91c are elastically transformed such that a relative position of the plate-like member 91b with respect to the frame part F9 is shifted to the +Z side.

Figure 4D:
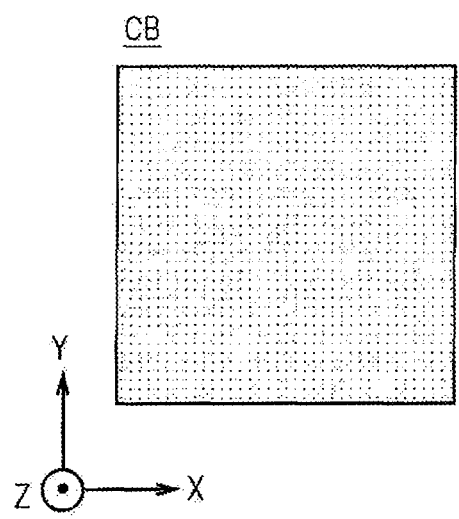

Protective Layer CB:

As shown in FIG. 4D, the protective layer CB is a plate-like transparent member with its board surface in substantially square shape and is made up, for example, of a resin, glass, or the like. The −Z side surface of a peripheral part of the protective layer CB is joined to the adjacent parallel spring upper layer 90 (specifically, the frame F9). The peripheral part of the protective layer CB may be structured, for example, to have a convex shape along the periphery, and joined on the upper end surface in convex shape.

<Structure of Camera Module Completed Type>

Figure 7A:
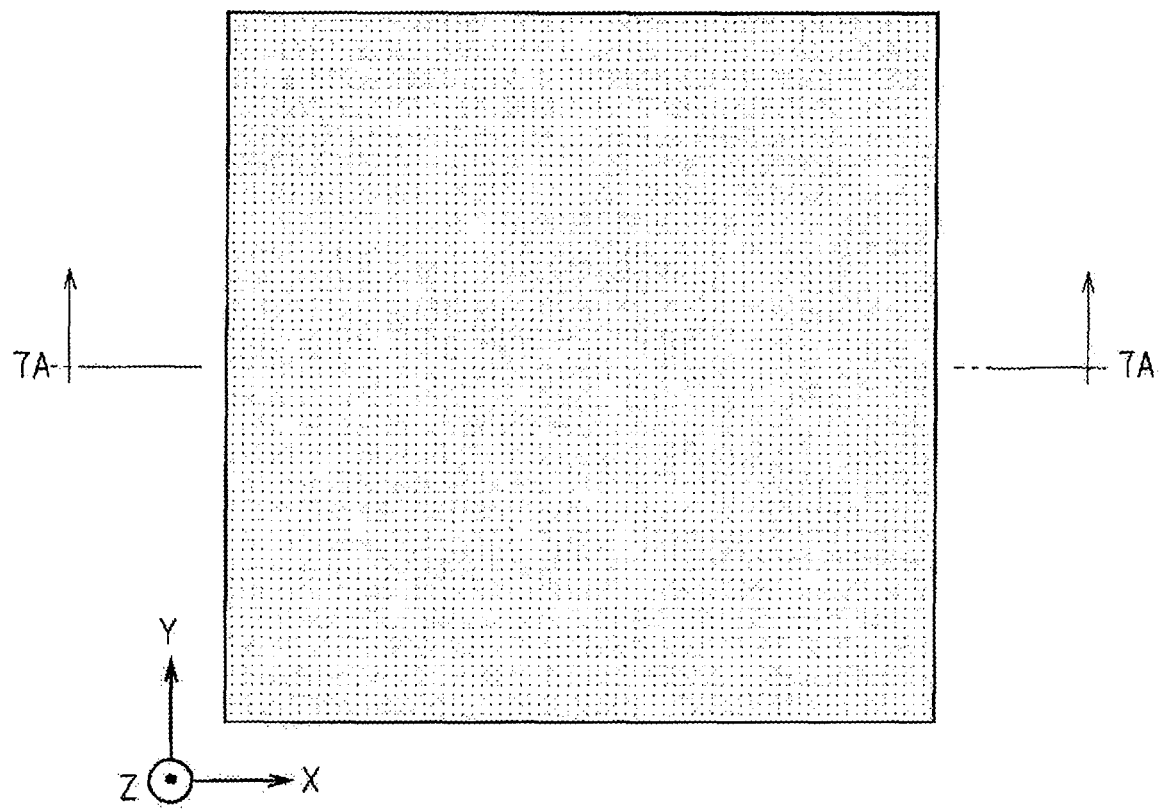
FIGS. 7A and 7B are views illustrating a structure of the camera module.
Figure 7B:
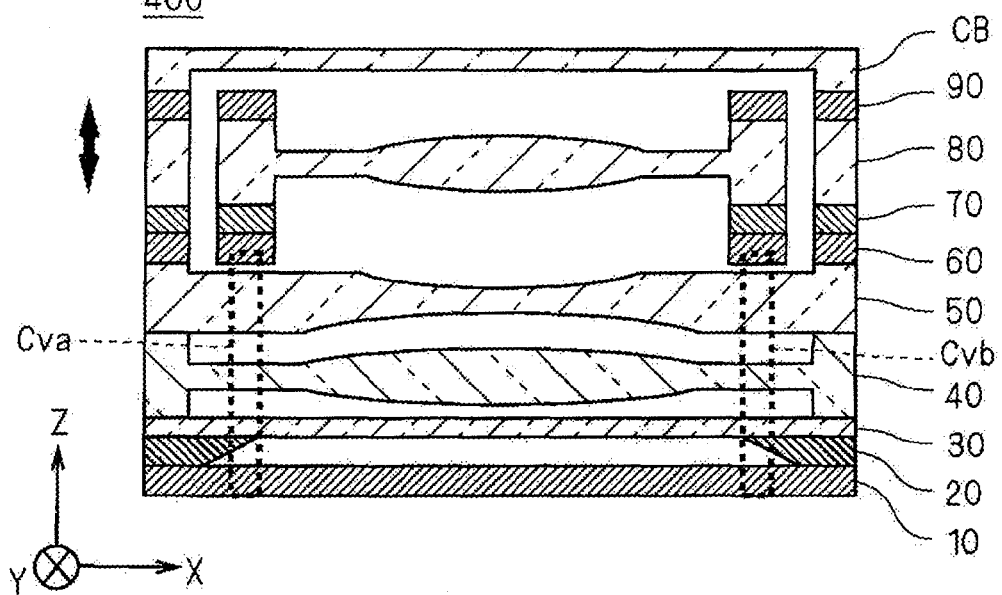

FIGS. 7A and 7B are views showing a structure of the camera module 400. Specifically, FIG. 7A is a plan view of the camera module 400 seen from the protective layer CB side (the top), and FIG. 7B is a sectional diagrammatic view seen from a section line 7A-7A of FIG. 7A. It should be noted that in FIG. 7B, one through hole Cva formed by linkage of the through holes Ca1 to Ca5, Ca61, Ca62 and one through hole Cvb formed by linkage of the through holes Cb1 to Cb5, Cb61, Cb62, which are located on the −Y side more closely than the section, are indicated by dotted lines so that positional relations of the respective holes can be seen.

As shown in FIG. 7B, the camera module 400 is formed by lamination of the imaging element layer 10, the imaging sensor holder layer 20, the infrared cut filter layer 30, the first lens layer 40, the second lens layer 50, the actuator layer 60, the parallel spring lower layer 70, the third lens layer 80, the parallel spring upper layer 90 and the protective layer CB in this order. Further, the through holes Cva, Cvb are each filled with the conductive material, to provide the actuator parts 61a, 61b of the actuator layer 60 with a voltage supplied from the rear surface (−Z side surface) of the imaging element layer 10.

It is to be noted that this camera module 400 is manufactured, for example, by micromachining technique that is used for integration of a micro device. As a kind of semiconductor processing technique, this technique is generally termed MEMS (Micro Electro Mechanical System). It is to be noted that fields where the name of the processing technique, MEMS, is used include fields where a micro sensor, an actuator, and an electromechanical structure with sizes on the order of µm are manufactured through use of the micro machining technique to which a semiconductor process, and especially an integrated circuit technique, has been applied. A manufacturing method for the camera module 400 will be further described later.

<Driving Aspect of Lens Part>

Figure 8A:
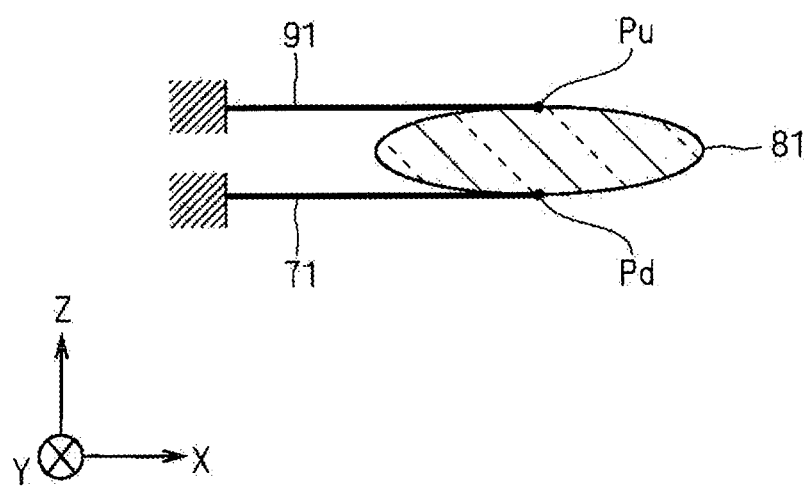
FIGS. 8A and 8B are views for explaining the driving aspects of a lens part included in a third lens layer.
Figure 8B:
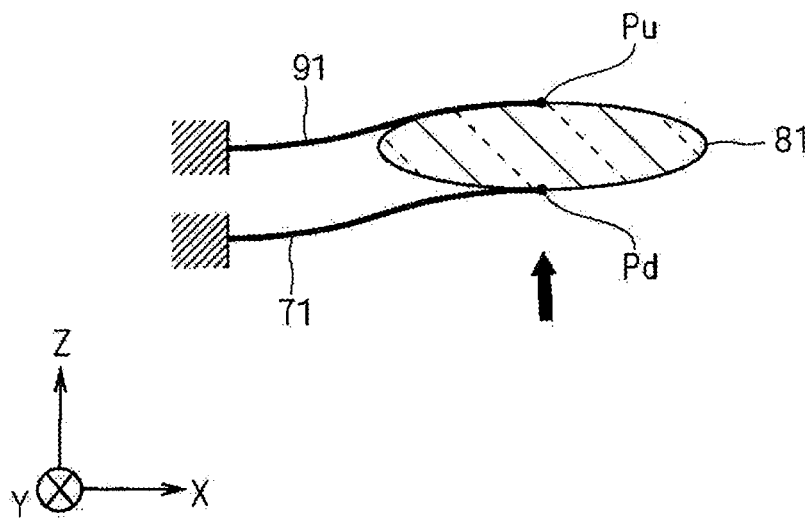

FIGS. 8A and 8B are views for explaining the driving aspects of the lens part 81 included in the third lens layer 80. FIGS. 8A and 8B show diagrammatic views of states of the lens part 81 and the elastic parts 71, 91 seen from the side. It is to be noted that, although the lens holder 83 is in practice held between the elastic parts 71 and 91, FIGS. 8A and 8B show the lens part 81 being held by the elastic parts 71, 91 at points Pu, Pd, for the sake of simplifying a description. Further, FIG. 8A shows a state (initial state) of the elastic parts 71, 91 having not been transformed, and FIG. 8B shows a state (transformed state) of the elastic parts 71, 91 having been transformed.

As described above, the elastic parts 71, 91 have similar configurations to each other, and respectively fixedly provided at two points of the frame parts F7, F9 in similar manners to each other. When the elastic part 71 transforms by transformation of the actuator parts 61a, 61b such that the plate-like member 71b rises, the elastic part 91 similarly transforms through the lens part 81. This is identifiable to a state where the lens part 81 is held between the plate-like members 71a, 91a and the plate-like members 71c, 91c which are provided in parallel at intervals of predetermined distances, and the plate-like members 71a, 91a and the plate-like members 71c, 91c perform substantially the same transformation in substantially the same timing. Therefore, the lens part 81 moves in a vertical direction (herein, the direction along the Z-axis) without inclination of an optical axis. In other words, a distance between the lens part 81 and the imaging element part 11 can be changed without displacement of the direction of the optical axis of the lens part 81. Consequently, the distance between the imaging element part 11 and the lens part 81 is changed, to execute focus adjustment.

<Camera-Module Manufacturing Step>

Figure 9:
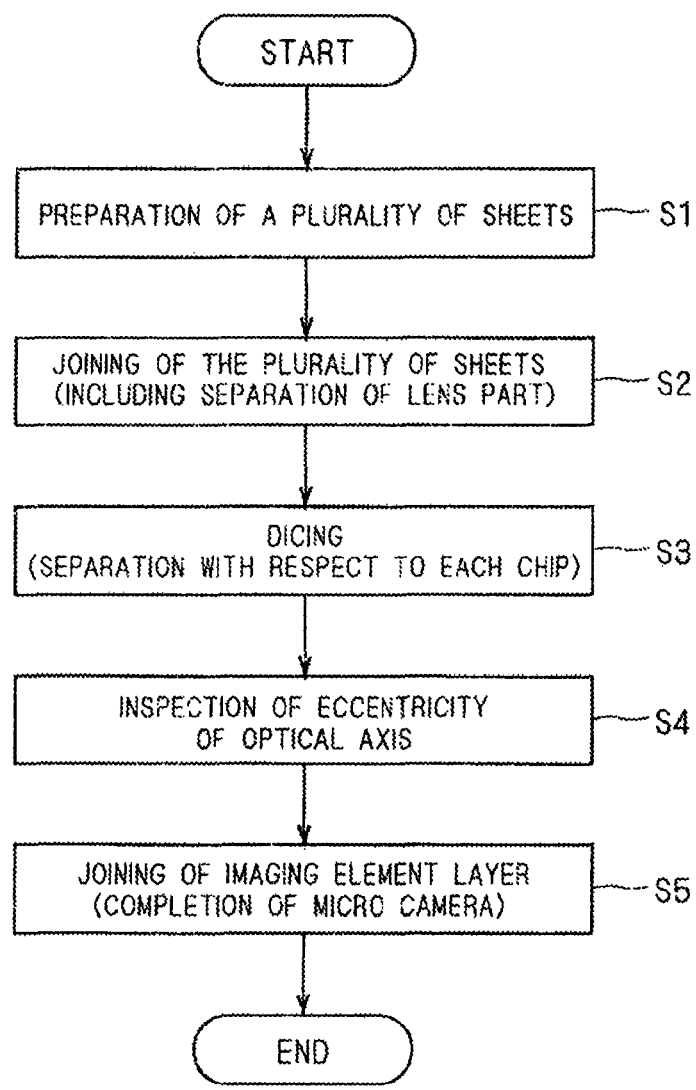
FIG. 9 is a flowchart showing a manufacturing process for the camera module.

FIG. 9 is a flowchart illustrating manufacturing process for the camera module 400. As shown in FIG. 9, the camera module 400 is manufactured by sequential performance of (Step A) preparation of a plurality of sheets (Step S1); (Step B) joining of the plurality of sheets (Step S2); (Step C) dicing (Step S3); (Step D) inspection of eccentricity of an optical axis (Step S4); and (Step E) binding of an imaging element layer (Step S5). Hereinafter, each of the steps will be described.

Preparation of a Plurality of Sheets (Step A):

FIGS. 10A to 10F and 11A to 11C are plan views showing constitutional examples of ten sheets U2 to U9, UCB to be prepared. Herein, a description will be given showing an example of each of the sheets U2 to U9, UCB being in disk shape.

Figure 10A:
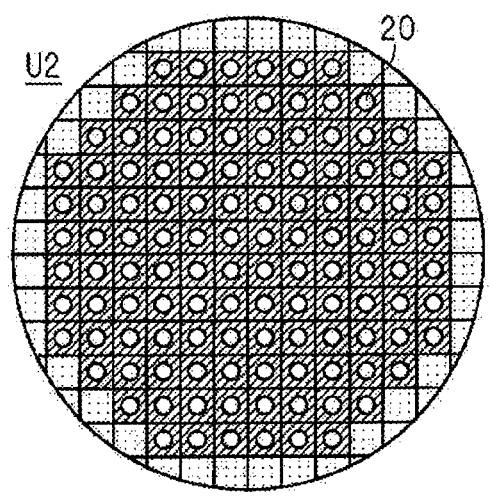
FIGS. 10A to 10F are plan views illustrating sheets to be prepared.

FIG. 10A is a view illustrating a sheet (imaging sensor holder sheet) U2 where a large number of chips corresponding to the imaging sensor holder layers 20 shown in FIG. 3B are formed in a predetermined array (herein, a matrix-like predetermined array). It is to be noted that herein, the wording "predetermined array" is used in the meaning of including a state where a large number of chips are arrayed at predetermined intervals in a predetermined direction. Further, this imaging sensor holder sheet U2 is manufactured, for example, with use of a resin material as a material by pressing with a metal mold. In addition, the through holes Ca2, Cb2 are formed, for example, by embossing, etching or the like. Herein, each imaging sensor holder layer 20 corresponds to a predetermined member to which the imaging element layer 10 having the imaging element part 11 is attached.

Figure 10D:
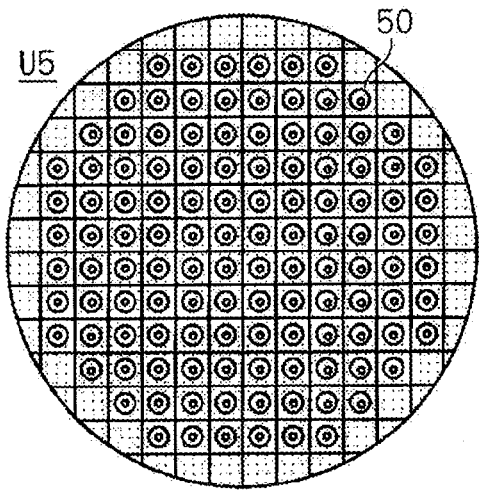
Figure 10B:
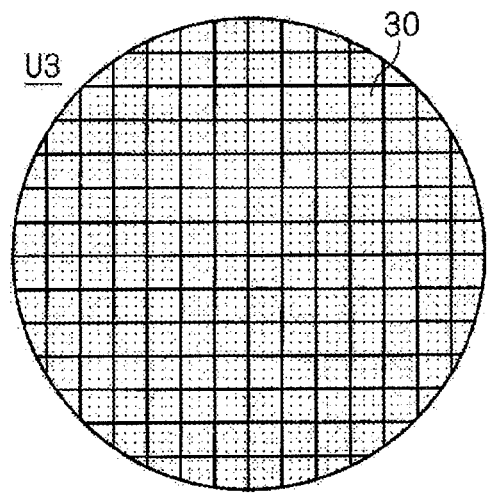

FIG. 10B is a view illustrating a sheet (infrared cut filter sheet) U3 where a large number of chips corresponding to the infrared cut filter layers 30 shown in FIG. 3C are formed in the predetermined array (herein, the matrix-like predetermined array). This infrared cut filter sheet U3 is manufactured, for example, by multi-layering of transparent thin films with different refractive indexes on a transparent substrate. Specifically, the sheet is manufactured by first preparing a substrate of glass or a transparent resin to be a substrate of the filter, and then laminating a large number of transparent thin films with different refractive indexes on the upper surface of the substrate by a technique such as sputtering or vapor deposition. It is to be noted that making an appropriate change in combination of the thicknesses or the refractive indexes of the transparent thin films can set a wavelength band of transmitted light. Herein, for example, a setting is made such that light with a wavelength band of not smaller than 600 nm is prevented from being transmitted, to block infrared light. In addition, the through holes Ca3, Cb3 are formed, for example, by embossing, etching or the like.

Figure 10E:
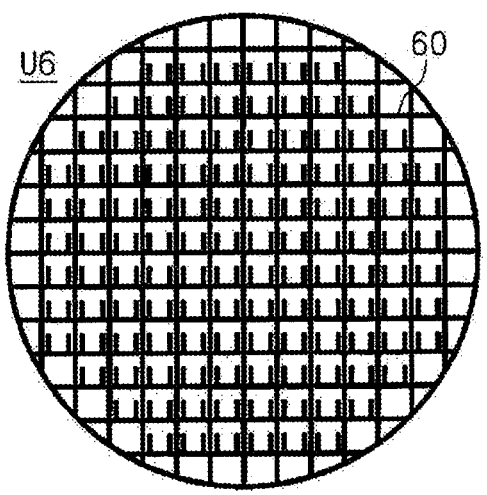
Figure 10C:
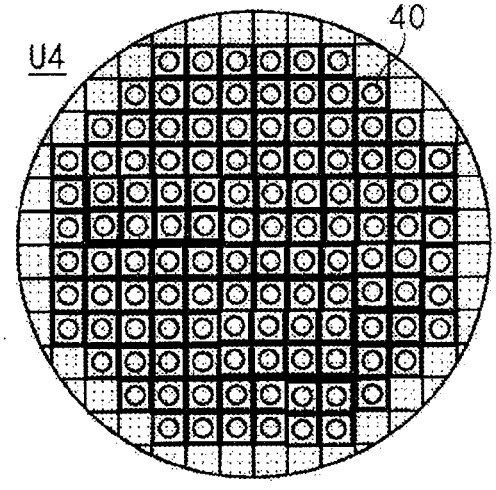

FIG. 10C is a view illustrating a sheet (first lens sheet) U4 where a large number of chips corresponding to the first lens layers 40 shown in FIG. 3D are formed in the predetermined array (herein, the matrix-like predetermined array), and FIG. 10D is a view illustrating a sheet (second lens sheet) U5 where a large number of chips corresponding to the second lens layers 50 shown in FIG. 3E are formed in the predetermined array (herein, the matrix-like predetermined array). For example, the first and second lens sheets U4, U5 are manufactured, for example, with use of a phenolic resin, an acrylic resin or optical glass as a material by a technique such as molding or etching. It should be noted that the through holes Ca4, Ca5, Cb4, Cb5 are formed, for example, by embossing, etching, or the like. Incidentally, in the case of forming a diaphragm in the camera module 400, for example, a thin film of a lightproof material may be formed on the second lens layers 50 and the like using a shadow mask, or a diaphragm may be formed of a resin material separately colored black, or the like.

FIG. 10E is a view illustrating a sheet (actuator sheet) U6 where a large number of chips corresponding to the actuator layers 60 shown in FIG. 3F are formed in the predetermined array (herein, the matrix like predetermined array). The actuator sheet U6 is manufactured, for example, by formation of a thin film of the shape-memory alloy (SMA) corresponding to an actuator element on a substrate of silicon (Si) or the like. Hereinafter, a description will be given with a specific example.

First, etching is performed as appropriate on a thin plate of silicon (or a metal), to form a base plate where a large number of base layers 601 (FIG. 5A) are formed in the predetermined array (herein, the matrix-like predetermined array).

Next, an insulating film is formed on a base plate by means of photolithography or the like, bringing about a state where the insulating layer 602 (FIG. 5B) is formed on each base layer 601. It is to be noted that the through holes Ca61, Ca62, Cb61, Cb62 are formed, for example, by embossing, etching, or the like. Further, at this time, a hole portion Ca6 formed by integral linkage of the through holes Ca61, Ca62 and a hole portion Cb6 formed by integral linkage of the through holes Cb61, Cb62 are plated with a metal. In addition, the through holes Ca61, Cb61 may, for example, be formed by etching such as DRIE (Deep Reactive Ion Etching) on the thin plate of silicon.

Next, the actuator element layer 603 (FIG. 5C) is formed, for example, by means of sputtering (or vapor deposition). At this time, the displacement element parts 613a, 613b and the electrode parts Ta, Tb come into the state of being formed on each insulating layer 602.

Next, the insulating/conductive layer 604 (FIG. 5D) is formed by formation of an insulating film by means of photolithography and formation of a metal thin film by means of sputtering (or vapor deposition). At this time, the insulating films 614a, 614b and the conductor parts Cna, Cnb come into the state of being formed on the displacement element parts 613a, 613b and the electrode parts Ta, Tb.

Next, the second actuator element layer 605 (FIG. 5E) is, for example, formed by means of sputtering (or vapor deposition). At this time, the displacement element parts 615a, 615b come into the state of being formed on the insulating films 614a, 614b and the conductor parts Cna, Cnb, while the connector part 615c that connects the displacement element parts 615a, 615b in a conductible manner comes into the state of being formed. The actuator parts 61a, 61b are then set into a mold of a shape wished to be memorized, which are then subjected to treatment (shape-memory treatment) of heating at a predetermined temperature (e.g. 600° C.).

Figure 10F:
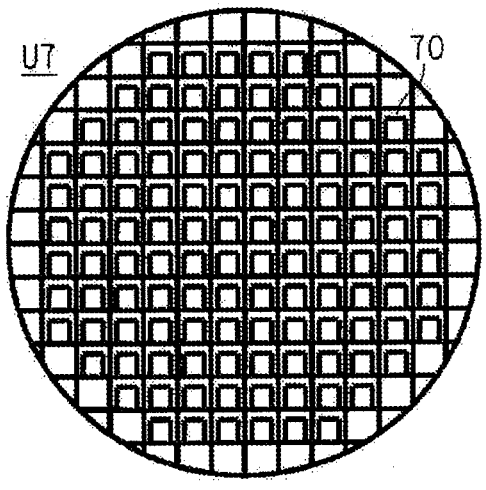
Figure 11A:
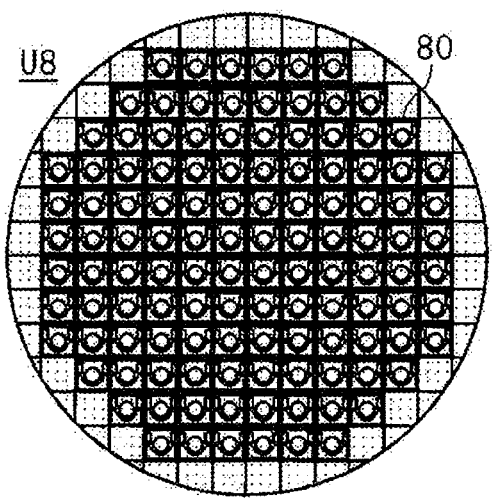
FIGS. 11A to 11C are plan views illustrating sheets to be prepared.
Figure 11B:
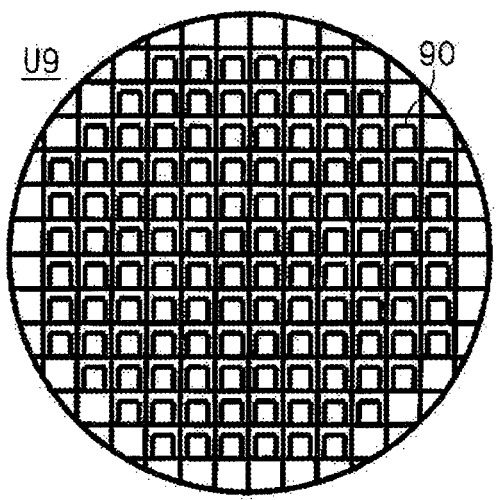

FIG. 10F is a view illustrating a sheet (parallel spring lower sheet) U7 where a large number of chips corresponding to the parallel spring lower layers 70 shown in FIG. 4A are formed in the predetermined array (herein, the matrix-like predetermined array), and FIG. 11B is a view illustrating a sheet (parallel spring upper sheet) U9 where a large number of chips corresponding to the parallel spring upper layers 90 shown in FIG. 4C are formed in the predetermined array (herein, the matrix-like predetermined array). The parallel spring lower sheet U7 and the parallel spring upper sheet U9 are manufactured, for example, by performing etching or the like on a thin plate of a metal material such as phosphor bronze.

FIG. 11A is a view illustrating a sheet (third lens sheet) U8 where a large number of chips corresponding to the third lens layers 80 shown in FIG. 4B are formed in the predetermined array (herein, the matrix-like predetermined array). The third lens sheet U8 are manufactured, for example, with use of a phenolic resin, an acrylic resin, or optical glass as a material by a technique such as molding or etching.

Figure 11C:
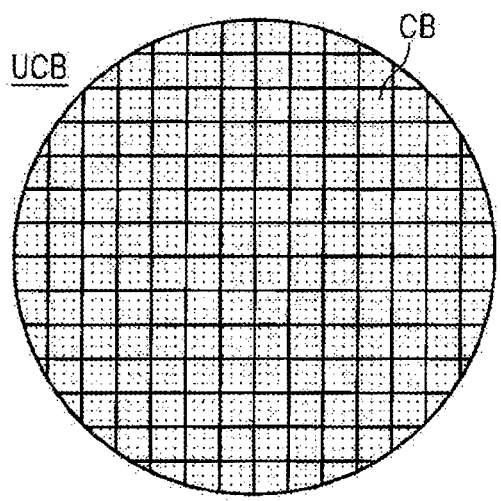

FIG. 11C is a view illustrating a sheet (protective sheet) UCB where a large number of chips corresponding to the protective layers CB shown in FIG. 4D are formed in the predetermined array (herein, the matrix-like predetermined array). The protective sheet UCB is, for example, a plate-like sheet manufactured by making a resin (glass) as a transparent material have a desired thickness, and performing etching as appropriate.

It is to be noted that in the ten sheets U2 to U9, UCB prepared herein, marks (alignment marks) for alignment in the sheet joining step are put in substantially the same positions. Examples of the alignment mark include a mark such as a cross, and the marks are preferably provided at two or more positions which are in the vicinity of the peripheral part of the upper surface of each of the sheets U2 to U9, UCB, and relatively separated.

Joining of the Plurality of Sheets (Step B):

FIG. 12 is a view diagrammatically showing a step of sequentially laminating and joining the plurality of sheets U2 to U9, UCB.

First, the imaging sensor holder sheet U2, the infrared cut filter sheet U3, the first lens sheet U4 and the second lens sheet U5 are subjected to alignment while remaining in sheet form such that chips of each of the sheets U2 to U5 are laminated immediately on one another. It is to be noted that in order to keep the accuracy of an optical system formed by the lens parts 41, 51, 81, a displacement amount (i.e. eccentricity accuracy) of optical axes of the three lens parts 41, 51, 81 are desirably within 5 μm.

Specifically, the imaging sensor holder sheet U2 and the infrared cut filter sheet U3 are first set in a known aligner, and alignment is performed using previously formed alignment marks. On this occasion, a so-called epoxy resin adhesive or ultraviolet cure adhesive is previously applied on a surface (joining surface) where the imaging sensor holder sheet U2 and the infrared cut filter sheet U3 are to be joined, and both sheets U2, U3 are joined. It is to be noted that a method may be used in which the joining surface is irradiated with $O_2$ plasma to activate the joining surface so as to directly join the sheets U2 and U3. However, considering simply joining a plurality of layers for a short period of time to seek improvement in productivity and reduction in manufacturing cost of the camera module 400, it is more preferable to use the above resin adhesive.

Subsequently, using similar alignment and joining methods to the above, the first lens sheet U4 is joined onto the infrared cut sheet U3, and further, the second lens sheet U5 is joined onto the first lens sheet U4.

At this time, in the respective sheets U2 to U5, through holes Ca2 to Ca5, Cb2 to Cb5 penetrating predetermined positions are respectively provided in the respective chips, and lamination and joining of the four sheets U2 to U5 lead to formation of a through hole obtained by integral linkage of the through holes Ca2 to Ca5 and a through hole obtained by integral linkage of the through holes Cb2 to Cb5 in each of the vertically laminated chips. A shadow mask or the like is provided in a portion other than the two through holes in each chip of the four sheets U2 to U5, and by a technique for plating a metal (e.g. gold, etc.) such as electroless plating, vertically conductible wiring are respectively formed with respect to the two through holes. The wiring forms wiring parts that provide the actuator parts 61a, 61b with the electric field.

Next, on the upper surface of a laminated body formed by lamination of the four sheets U2 to U5, the actuator sheet U6, the parallel spring lower sheet U7, the third lens sheet U8 and the parallel spring upper sheet U9 are laminated and joined in this order sequentially from the bottom. Alignment and joining methods are similar to the techniques according to the foregoing sheets U2, U3, and at this time, each chip of the sheets U2 to U9 is laminated immediately on one another.

In this occasion, the lens part 81 of the third lens sheet U8 comes into the state of being supported by the actuator parts 61a, 61b of the actuator sheet U6 through the elastic part 71 of the parallel spring lower sheet U7. Further, with the sheets U7 to U9 laminated and bound, the lens holder 83 is held between the elastic parts 71, 91 from the upper and lower surfaces, and the lens part 81 comes into the state of being supported by the elastic parts 71, 91. At this time, in each chip of the third lens sheet 158, the couplers 84a, 84b (cf. FIG. 4D) that couple the frame part F8 and the lens part 81 through the lens holder 83 are cut by a so-called femtosecond laser or the like, to separate the frame part F8 and the lens part 81.

As thus described, in the state of the sheet formed with a plurality of chips, the lens part 81 in each chip is supported by the elastic parts 71, 91, and thereafter brought into a movable state. It is thus possible to perform precise alignment of the lens part 81 and the actuator parts 61a, 61b. In other words, for example, it is possible to prevent eccentricity of the optical axis of the lens part in each optical unit (later described), and the like.

Finally, the protective sheet UCB is aligned and joined to the upper surface of the parallel spring upper sheet U9 in a similar manner to the foregoing technique. At this time, a member (laminated member) is formed where the nine sheets U2 to U9, UCB are laminated.

Dicing (Step C):

The formed laminated member where the nine sheets U2 to U9, UCB are laminated are cut with respect to each chip by means of a dicing device, to generate a large number of optical system units (optical units) where the nine layers 20 to 90 and CB are laminated.

Inspection of Eccentricity of Optical Axis (Step D):

The large number of optical units generated by dicing are inspected with lens eccentricity measuring instrument as to whether or not displacement amounts (i.e. eccentricity) of the optical axes of the three lens parts 41, 51, 81 are within a predetermined tolerance range (e.g. within 5 μm).

Herein, a reason for performing the inspection of eccentricity of the optical axes is briefly described. Generally, the highest-priced one among the components constituting the camera module 400 is the imaging element layer 10. The camera module 400 with the eccentricity of the optical axis being out of the predetermined tolerance range is treated as a defective product. Therefore, sorting-out for defective and non-defective products is performed at the stage of the optical unit and the imaging element layer 10 is mounted only on a non-defective product, whereby it is possible to seek reduction in manufacturing cost of the camera module 400 and waste of resources.

Binding of Imaging Element Layer (Step E):

The lower surface of each optical unit discriminated as a non-defective product by the inspection of eccentricity of the optical axis (specifically, the rear surface of the imaging sensor holder layer 20) is mounted with the chip of the imaging element layer 10 by joining with use of a so-called epoxy resin adhesive or ultraviolet cure adhesive, to complete the camera module 400.

As thus described, the camera module 400 according to the embodiment of the present invention is formed by lamination of the plurality of layers 10 to 90, CB which include the imaging element layer 10, the third lens layer 80 and the actuator layer 60. Hence it is possible to satisfy both higher functionality and higher accuracy in a compact imaging device.

Further, the adjacent layers included in the plurality of layers 10 to 90, CB constituting the camera module 400 are joined on the peripheral part F1 and the frame parts F4 to F9. This can facilitate sealing of the imaging element part 11, the lens parts 41, 51, 81 and the actuator parts 61a, 61b.

Moreover, in the manufacturing step of the camera module 400 according to the present embodiment, after integral formation of a plurality of optical units each having a plurality of functions including the lens part 81 and the actuator parts 61a, 61b, each optical unit is separated. It is therefore possible to readily and accurately combine members that realize a plurality of functions. In other words, it is possible to satisfy both higher functionality and higher accuracy in a compact imaging device.

Moreover, after checking of a combination status of the optical units having a plurality of functions including the lens part 81 and the actuator parts 61a, 61b, the imaging element layer 10 is mounted. It is therefore possible to reduce wasteful disposal of the imaging element part 11 associated with failure of the optical unit. In other words, it is possible to reduce manufacturing cost of the imaging device and waste of resources.

MODIFIED EXAMPLE

The present invention is not restricted to the foregoing embodiment, and a variety of modifications, improvements and the like can be made within a range not deviating from the gist of the present invention.

For example, in the above embodiment, the camera module 400 is formed by lamination of ten layers, but this is not restrictive. For example, as for the third lens layer 80, considered can be a configuration where the lens part 81 having the lens power and the frame part F8 are linked by a thin plate-like elastic member formed of the same material as that for the lens part 81 at at least two points around the lens part 81, and the parallel spring lower layer 70 and the parallel spring upper layer 90 are thereby omitted. In other words, as for the third lens layer 80, one formed by linkage of the frame part F8 and the lens part 81 by at least three elastic members from different directions around the lens part 81 may be adopted. It is to be noted that the places provided with three or more elastic members are desirably places where the frame part F8 can support the lens part 81 in a balanced manner, such as substantially evenly spaced positions along direction of a circumference with the optical axis of the lens part 81 at the center.

According to such a configuration, for example, the other layers 70, 90 having the elastic parts 71, 91 for holding the lens part 81 become unnecessary, whereby it is possible to seek improvement in assembly accuracy due to simplification of the structure of the imaging device 400, and reduction in thickness and size of the imaging device 400.

Further, the first and second lens layers 40, 50 can also be omitted as appropriate depending upon a design of the optical system. Therefore, from the viewpoint of accurately supporting the lens part 81 by the actuator part, the camera module 400 may be formed by lamination of a plurality of layers at least including the lens layer 80 that has the moving lens part 81 and the actuator layer 60 that moves the lens part 81.

It should be noted that in the foregoing configuration where the parallel spring lower layer 70 and the parallel spring upper layer 90 are omitted, as compared with the above embodiment, there is no need for cutting the couplers 84*a*, 84*b* by a laser or the like, and it is thus possible to accurately assemble a camera module while suppressing generation of eccentricity of the optical axis in the lens part 81.

Further, in the above embodiment, the eccentricity of the optical axis of the optical unit is inspected after dicing and the imaging element layer 10 is mounted on a non-defective optical unit, but this is not restrictive. For example, in a case where the accuracy of lamination of the nine sheets U2 to U9, UCB is high, a sheet (image element sheet) formed with a large number of imaging element layers 10 shown in FIG. 3A in the predetermined array (herein, the matrix-like predetermined array) may be previously formed on a predetermined substrate (e.g. silicon substrate), and at the time of laminating the nine sheets U2 to U9, UCB, the imaging element sheet is aligned, laminated and joined along therewith, and thereafter, dicing may be performed, so as to complete a large number of camera modules 400. Adopting such a configuration facilitates alignment at the time of joining the imaging element layer 10, whereby it is possible to readily and accurately combine members that realize a plurality of functions, including the imaging element part 11.

Further, in the above embodiment, with the state of the four sheets U2 to U5 being in a laminated state, the through hole formed by integral linkage of the through holes Ca2 to Ca5 and the through hole formed by integral linkage of the through holes Cb2 to Cb5 are plated with a metal to form wiring, but this is not restrictive. For example, in the case of laminating and joining the imaging element sheet before dicing, after lamination and joining of the plurality of sheets U2 to U9, UCB, the through hole formed by integral linkage of the through holes Ca1 to Ca5, Ca61, Ca62 and the through hole formed by integral linkage of the through holes Cb1 to Cb5, Cb61, Cb62 may be plated with a metal, to form the wiring CTa, CTb.

Further, in the five sheets U2 to U6, the through holes Ca2 to Ca5, Ca61, Ca62, Cb2 to Cb5, Cb61, Cb62 may be previously filled with a conductive material by being plated with a metal or the like with respect to each sheet, and at the time of laminating the five sheets U2 to U6, the wiring CTa, CTb may be formed. It should be noted that in order to seek reduction in contact resistance between each layer, the through holes Ca2 to Ca5, Ca61, Ca62, Cb2 to Cb5, Cb61, Cb62 are preferably filled with the conductive material to such a degree that the conductive material slightly run off from the respective holes.

Further, in the above embodiment, the wiring CTa, CTb for voltage supply which penetrate the five layers among the ten layers constituting the camera module 400 are provided, but this is not restrictive. For example, as for the imaging element layer 10, the wiring penetrating therethrough may not be provided, and similarly to all kinds of wiring for signals disposed inside the imaging element layer 10, wiring for voltage supply may be provided as appropriate within the imaging element layer 10, and a terminal part electrically connectable to the wiring may be provided from the rear surface or the side surface of the imaging element layer 10. Even when such a configuration is adopted, the wiring part for providing the actuator parts with the electric field may be readily and accurately formed as with the above embodiment.

Incidentally, as described above, the first and second lens layers 40, 50 can also be omitted as appropriate depending upon the design of the optical system. Therefore, from the viewpoint of readily and accurately forming the wiring part for providing the actuator parts 61*a*, 61*b* with the electric field, there may be provided wiring that penetrates one or more layers which are disposed between the imaging element layer 10 and the actuator layer 60 among the plurality of layers constituting the camera module 400, and provides the actuator layer 60 with the electric field.

Further, in the above embodiment, the through holes Ca61, Cb61 are provided in the base layer 601 and then filled with the conductive material, but this is not restrictive, and for example, a silicon thin plate to be a material for the base layer 601 may be subjected to ion doping so as to form a conductible area.

Further, in the above embodiment, each of the through holes Ca2 to Ca5, Cb2 to Cb5 penetrating the plurality of sheets U2 to U5 are formed with respect to each sheet, but this is not restrictive. For example, after lamination and joining of the sheets U2 to U5, a through hole with a size of the order of several tens of μm penetrating the four sheets may be formed by so-called femtosecond laser or excimer laser, ion etching, or the like.

Further, in the above embodiment, the voltage is applied to the actuator parts 61*a*, 61*b* by the wiring CTa, CTb that penetrate the plurality of layers, but this is not restrictive. For example, wiring for electrically connecting the terminal part disposed on the outer edge of the actuator layer 60 and the actuator parts 61*a*, 61*b* may be provided. At this time, the terminal part functions as a terminal for electrically connecting wiring for providing the electric field from the outside of the actuator layer 60 to the actuator parts 61a, 61b. Adopting such a configuration facilitates formation of each layer disposed between the imaging element layer 10 and the actuator layer 60.

Further, in the above embodiment, the shape-memory alloy (SMA) is used as the actuator element, but this is not restrictive, and for example, an piezoelectric element such as an inorganic piezoelectric body of PZT (Pb(lead) zirconate titanate) or the like, or an organic piezoelectric body of polyvinylidene fluoride (PVDF) or the like may be used. In the case of employing a thin film of the piezoelectric element as the actuator element, for example, an electrode, the thin film of the piezoelectric element and an electrode may be formed in this order on the base layer 601 by sputtering or the like, and a high electric field may be applied to perform polling.

Further, in the above embodiment, the actuator parts 61a, 61b are formed by formation of the thin film of the actuator element on the base layer 601 through the insulating layer 602 and the insulating films 614a, 614b, but this is not restrictive. For example, the actuator parts 61a, 61b are formed on the base layer 601 by formation of metal thin films having different rates (linear expansion ratios or linear expansion coefficients) at which the length changes with increase in temperature, as compared with the material for the base layer 601. It is to be noted that as combination of materials having different line expansion coefficients, for example, an aspect of silicon (Si) constituting the base layer and aluminum (Al) constituting the metal thin film can be considered.

Further, in the above embodiment, the elastic parts 71, 91 are respectively fixedly provided at two points of the frame parts F7, F9, but this is not restrictive, and a variety of configurations may be applied. However, in order to move the lens part 81 without inclination of the optical axis of the lens 81 as described above, it is preferable that the elastic parts 71, 91 be respectively fixedly provided at two or more points of the frame part F7, F9.

Further, in the above embodiment, both ends of the elastic part 71 are fixedly provided to a total of two points of the frame part F7 and both ends of the elastic part 91 are fixedly provided to a total of two points of the frame part F9, but this is not restrictive. For example, there can be considered a configuration in which the elastic parts 71, 91 are respectively dually divided at the center portions and one end and the other end of the dually divided elastic part 71 are respectively fixedly provided on the frame part F7 so as to be fixedly provided at a total of two points, and one and the other end of the dually divided elastic part 91 are respectively fixedly provided on the frame part F9 so as to be fixedly provided at a total of two points.

EXPLANATION OF REFERENCE NUMERALS

10: imaging element layer
11: imaging element part
20: imaging sensor holder layer
30: infrared cut filter layer
40: first lens layer
41, 51, 81: lens part
50: second lens layer
60: actuator layer
61a, 61b: actuator part
70: parallel spring lower layer
71, 91: elastic part
80: third lens layer
83: lens holder
84a, 84b: coupler
90: parallel spring upper layer
100: mobile telephone
400: camera module
Ca1 to Ca5, Ca61, Ca62, Cb1 to Cb5, Cb61, Cb62, Cva, Cvb: through hole
CB: protective layer
CTa, CTb: wiring
F1: peripheral part
F4 to F9: frame part
U2: imaging sensor holder sheet
U3: infrared cut filter sheet
U4: first lens sheet
U5: second lens sheet
U6: actuator sheet
U7: parallel spring lower sheet
U8: third lens sheet
U9: parallel spring upper layer
UCB: protective sheet

The invention claimed is:

1. An imaging device manufacturing method, comprising:
preparing a plurality of sheets that include a first sheet formed in a predetermined array with a plurality of chips each having a lens part, and a second sheet formed in said predetermined array with a plurality of chips each having an actuator part;
joining by laminating said plurality of sheets such that each of said lens parts is respectively supported by each of said actuator parts, to form a laminated member; and
cutting said laminated member with respect to each of said chips, to generate a plurality of units each having said lens part and said actuator part that movably supports said lens part, wherein
said plurality of sheets further include a third sheet which is formed in said predetermined array with a plurality of chips each having an imaging element part, and
each chip of said third sheet has a first frame part which surrounds said lens part, and a coupler which couples said first frame part and said lens part,
said plurality of sheets include
a fifth sheet formed in said predetermined array with a plurality of chips each having a second frame part to be joined with said first frame part from one direction, and a first elastic part fixedly provided at at least two points of said second frame part, and
a sixth sheet formed in said predetermined array with a plurality of chips each having a third frame part to be joined with said first frame part from the opposite direction to said one direction, and a second elastic part fixedly provided at at least two points of said third frame part, and
laminating the fifth and sixth sheets such that said lens part is supported by said first elastic part and said second elastic part; and
cutting the coupler after said first, fifth and sixth sheets have been laminated and bound such that said lens part is supported by said first elastic part and said second elastic part to separate said first frame part and said lens part.

2. The imaging device manufacturing method of claim 1, further comprising:
mounting an imaging element layer, which has an imaging element part, on each unit generated in a unit generating step.

3. The imaging device manufacturing method of claim 1, wherein
said plurality of sheets include a fourth sheet that is formed in said predetermined array with a plurality of chips, each of which has predetermined members and is to be mounted with each of said imaging element parts, one or more sheets among said plurality of sheets, which include said fourth sheet and are laminated more closely to said fourth sheet side than said second sheet in said laminated member forming step, respectively have hole parts penetrating predetermined positions of the respective chips, and said imaging device manufacturing method further comprises:

plating each of said hole parts with a metal during the joining by laminating in or after said joining by laminating, to form a wiring part, which provides said actuator part with an electric field.

4. The imaging device manufacturing method of claim 1, wherein the joining comprises two adjacent sheets included in said plurality of sheets being bound by a resin.

5. The imaging device manufacturing method of claim 1,
wherein the actuator part comprises a thin plate-like element that expands and contracts in accordance with an application of a voltage, and wherein said thin plate-like element is a shape-memory alloy.

6. The image device manufacturing method of claim 1, wherein the actuator part comprises a thin plate-like element that expands and contracts in accordance with an application of a voltage, each chip of said second sheet includes a frame part having an opening, said plate-like actuator part projected from said frame part toward said opening, and the actuator part is configured to displace an end of said opening side by application of a voltage to said thin plate-like element.

* * * * *